(12) United States Patent
Hwang et al.

(10) Patent No.: US 9,807,884 B2
(45) Date of Patent: Oct. 31, 2017

(54) SUBSTRATE COMPRISING EMBEDDED ELONGATED CAPACITOR

(71) Applicant: QUALCOMM Incorporated, San Diego, CA (US)

(72) Inventors: Kyu-Pyung Hwang, San Diego, CA (US); Young Kyu Song, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 269 days.

(21) Appl. No.: 14/579,651

(22) Filed: Dec. 22, 2014

(65) Prior Publication Data

US 2016/0183378 A1    Jun. 23, 2016

(51) Int. Cl.
  *H05K 1/18*   (2006.01)
  *H05K 1/11*   (2006.01)
  (Continued)

(52) U.S. Cl.
  CPC .......... *H05K 1/185* (2013.01); *H01G 4/005* (2013.01); *H01G 4/012* (2013.01); *H01G 4/232* (2013.01); *H01G 4/248* (2013.01); *H01L 23/50* (2013.01); *H01L 23/5383* (2013.01); *H05K 1/0231* (2013.01); *H05K 1/0298* (2013.01); *H05K 1/111* (2013.01); *H05K 1/115* (2013.01); *H05K 3/30* (2013.01); *H05K 3/4007* (2013.01); *H05K 3/4038* (2013.01); *H05K 3/46* (2013.01); *H05K 3/4697* (2013.01); *H01G 4/30* (2013.01); *H01L 24/16* (2013.01); *H01L 25/0655* (2013.01); *H01L 2224/16227* (2013.01); *H01L 2924/15174* (2013.01); *H01L 2924/15311* (2013.01); *H05K 3/4602* (2013.01); *H05K 2201/0187* (2013.01);
  (Continued)

(58) Field of Classification Search
  USPC ............................... 361/763, 761; 174/260
  See application file for complete search history.

(56) References Cited

U.S. PATENT DOCUMENTS 7,394,643 B2   7/2008   Yamane et al.
8,546,700 B2   10/2013  Yamamoto et al.
(Continued)

FOREIGN PATENT DOCUMENTS

EP   1115129 A2   7/2001

OTHER PUBLICATIONS

International Search Report and Written Opinion—PCT/US2015/066430—ISA/EPO—dated May 30, 2016.

*Primary Examiner* — Andargie M Aychillhum
(74) *Attorney, Agent, or Firm* — Loza & Loza, LLP/Qualcomm

(57) ABSTRACT

A substrate that includes a first dielectric layer and a capacitor embedded in the first dielectric layer. The capacitor includes a first terminal, a second terminal, and a third terminal. The second terminal is laterally located between the first terminal and the third terminal. The capacitor also includes a second dielectric layer, a first metal layer and a second metal layer. The first metal layer is coupled to the first and third terminals. The first metal layer, the first terminal, and the third terminal are configured to provide a first electrical path for a first signal. The second metal layer is coupled to the second terminal. The second metal layer and the second terminal are configured to provide a second electrical path for a second signal.

19 Claims, 20 Drawing Sheets

(51) Int. Cl.

| | |
|---|---|
| *H05K 1/02* | (2006.01) |
| *H05K 3/46* | (2006.01) |
| *H05K 3/30* | (2006.01) |
| *H05K 3/40* | (2006.01) |
| *H01G 4/248* | (2006.01) |
| *H01G 4/012* | (2006.01) |
| *H01G 4/005* | (2006.01) |
| *H01G 4/232* | (2006.01) |
| *H01L 23/538* | (2006.01) |
| *H01L 23/50* | (2006.01) |
| *H01G 4/30* | (2006.01) |
| *H01L 23/00* | (2006.01) |
| *H01L 25/065* | (2006.01) |

(52) U.S. Cl.
CPC .............. *H05K 2201/09781* (2013.01); *H05K 2201/10015* (2013.01); *H05K 2201/10636* (2013.01); *Y02P 70/611* (2015.11)

(56) References Cited

U.S. PATENT DOCUMENTS

| | | |
|---|---|---|
| 2009/0002921 A1 | 1/2009 | Ritter et al. |
| 2010/0155124 A1 | 6/2010 | Kawamura et al. |
| 2010/0300602 A1* | 12/2010 | Ichiyanagi ............. H01G 4/232 156/89.12 |
| 2011/0013341 A1 | 1/2011 | Park et al. |
| 2011/0037536 A1 | 2/2011 | Kanno et al. |
| 2012/0018198 A1 | 1/2012 | Furutani et al. |
| 2013/0155574 A1* | 6/2013 | Park ....................... H01G 4/012 361/321.3 |
| 2015/0041198 A1 | 2/2015 | Lee et al. |

\* cited by examiner

● = First Signal (e.g., Power)

○ = Second Signal (e.g., Ground Reference)

● = First Signal (e.g., Power)

◯ = Second Signal (e.g., Ground Reference)

SUBSTRATE COMPRISING EMBEDDED ELONGATED CAPACITOR

BACKGROUND

Field

Various features relate to a substrate that includes an embedded elongated capacitor.

Background

FIG. 1 illustrates a configuration of an integrated package that includes a die. Specifically. FIG. 1 illustrates an integrated package 100 that includes a package substrate 104 and a first die 106. The integrated package 100 is coupled to a printed circuit board (PCB) 102 through a first set of solder balls 105. The first die 106 is coupled to the package substrate 104 through a second set of solder balls 107. The package substrate 104 includes one or more dielectric layers 110, and a set of interconnects 112 (e.g., traces and vias). The set of interconnects 112 is coupled to the first and second set of solder balls 105 and 107. A capacitor 120 is coupled to the PCB 102. The capacitor 120 is located near the integrated package 100 on the PCB 102. The capacitor 120 may be used as a decoupling capacitor in a power distribution network.

One drawback of the integrated package 100 and capacitor 120 shown in FIG. 1 is that it creates an integrated device with a form factor that may be too large for the needs of mobile computing devices. This may result in a package that is either too large and/or too thick. That is, the integrated package and capacitor combination shown in FIG. 1 may be too thick and/or have a surface area that is too large to meet the needs and/or requirements of mobile, wearable or portable computing devices. For example, the placement of the capacitor 120 laterally to the integrated package 100 creates a surface area on the PCB 102 that may be too large to meet the needs mobile, wearable or portable computing devices.

Therefore, there is a need for an integrated device that includes a capacitor that utilizes less space while at the same time provides better capacitive capabilities. Ideally, such an integrated device will have a better form factor, while at the same time meeting the needs and/or requirements of mobile, wearable or portable computing devices.

SUMMARY

Various features, apparatus and methods described herein a substrate that includes an embedded elongated capacitor.

A first example provides a substrate that includes a first dielectric layer and a capacitor embedded in the first dielectric layer. The capacitor includes a first terminal, a second terminal, and a third terminal, where the second terminal is laterally located between the first terminal and the third terminal. The capacitor also includes a second dielectric layer, a first metal layer in the second dielectric layer, and a second metal layer in the second dielectric layer. The first metal layer is coupled to the first and third terminals. The first metal layer, the first terminal, and the third terminal are configured to provide a first electrical path for a first signal. The second metal layer is coupled to the second terminal. The second metal layer and the second terminal configured to provide a second electrical path for a second signal.

A second example provides a method for fabricating a substrate. The method forms a first dielectric layer. The method provides a capacitor in the first dielectric layer. The method of providing the capacitor includes providing a first terminal, a second terminal, a third terminal, where the second terminal is laterally located between the first terminal and the third terminal, a second dielectric layer, a first metal layer in the second dielectric layer, the first metal layer coupled to the first and third terminals, the first metal layer, the first terminal, and the third terminal configured to provide a first electrical path for a first signal, and a second metal layer in the second dielectric layer, the second metal layer coupled to the second terminal, the second metal layer and the second terminal are configured to provide a second electrical path for a second signal.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some features pertain to a substrate (e.g., a package substrate, an interposer) that includes a core layer, a first dielectric layer and a capacitor embedded in the first dielectric layer. The first dielectric layer is coupled to the core layer. The capacitor includes a first terminal, a second terminal, and a third terminal. The second terminal is laterally located between the first terminal and the third terminal. The capacitor also includes a second dielectric layer, a first metal layer and a second metal layer. The first metal layer is in the second dielectric layer. The first metal layer is coupled to the first and third terminals. The first metal layer, the first terminal, and the third terminal are configured to provide a first electrical path for a first signal. The second metal layer is in the second dielectric layer. The second metal layer is coupled to the second terminal. The second metal layer and the second terminal are configured to provide a second electrical path for a second signal. In some implementations, the capacitor further includes a fourth terminal, a fifth terminal, a third metal layer, and a fourth metal layer. The third metal layer is in the second dielectric layer. The third metal layer is coupled to the fourth terminal. The fourth metal layer is in the second dielectric layer. The fourth metal layer is coupled to the fifth terminal. The third and fourth metal layers are configured to change an equivalent series resistance (ESR) of the capacitor. In some implementations, the fourth and fifth terminals are dummy terminals that are configured to be free of a traversing signal in the substrate.

In some implementations, an interconnect is an element or component of a device (e.g., integrated device, integrated device package, die) and/or a base (e.g., package substrate, printed circuit board, interposer) that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that provides an electrical path for a signal (e.g., data signal, ground signal, power signal). An interconnect may include more than one element/component.

Exemplary Elongated Capacitor

Figure 1:
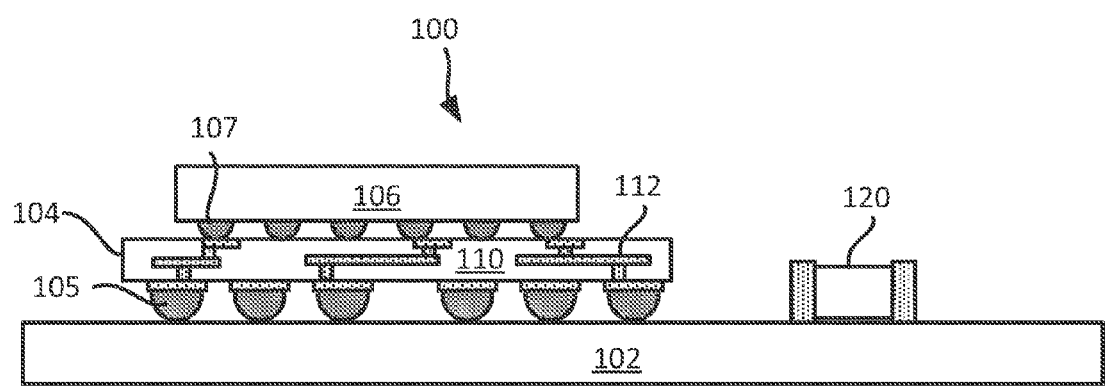
FIG. 1 illustrates an integrated device package next to a capacitor.
Figure 2:
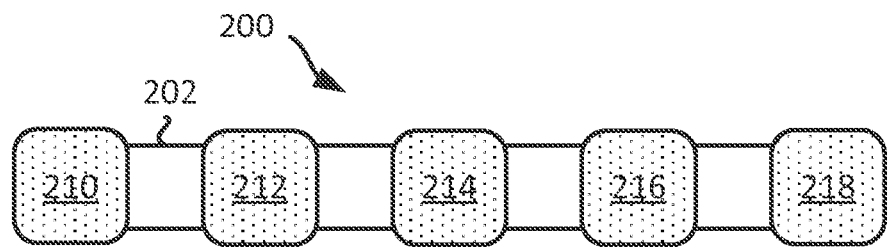
FIG. 2 illustrates an example of an elongated capacitor.

FIG. 2 illustrates an example of an elongated capacitor 200. The capacitor 200 includes a base portion 202, a first terminal 210, a second terminal 212, a third terminal 214, a fourth terminal 216, and a fifth terminal 218. The base portion 202 includes one or more dielectric layers and several metal layers (e.g., metal plates, electrically conductive plates). The first terminal 210, the second terminal 212, the third terminal 214, the fourth terminal 216, and the fifth terminal 218 are conductive materials (e.g., one or more metal layers), where each terminal is coupled (e.g., electrically coupled) to one or more of the metal layers in the base portion 202. In some implementations, the capacitor 200 is an elongated multi layer ceramic capacitor (MLCC). An elongated capacitor is a capacitor that has a length (L) that is greater than the width (W) and the depth (D) of the capacitor. In some implementations, the capacitor 200 is embedded in a substrate, such as a packaging substrate and/or an interposer.

Figure 3:
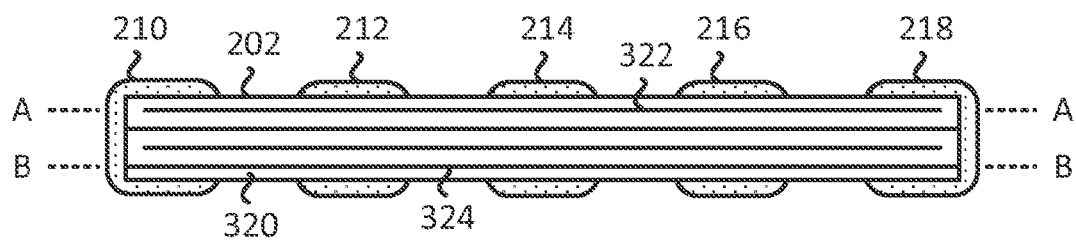
FIG. 3 illustrates an example of a profile view of a cross section of an elongated capacitor.

FIG. 3 illustrates an example of a profile view of a cross section of the capacitor 200 of FIG. 2. As shown in FIG. 3, the base portion 202 of the capacitor 200 includes a dielectric layer 320 and several metal layers (e.g., first set of metal layers and a second set of metal layers). For example, the base portion 202 includes a first metal layer 322 and a second metal layer 324. The first metal layer 322 (e.g., first metal plate) is part of a first set of metal layers, and the second metal layer 324 (e.g., second metal plate) is part of a second set of metal layers. Although FIG. 3 illustrates a base portion 202 that includes four (4) metal layers, different implementations may include a different number of metal layers with different configurations and combinations of different metal layers.

The first set of metal layers (e.g., first metal layer 322) may be configured to electrically provide a first path for a first signal (e.g., ground reference, power signal, I/O signal). The second set of metal layers (e.g., second metal layer 324) may be configured to electrically provide a second path for a second signal (e.g., ground reference, power signal, I/O signal) that is different than the first signal. An example of how the capacitor 200 is configured to provide an electrical path for signals is further described in at least FIG. 6 below.

Figure 4:
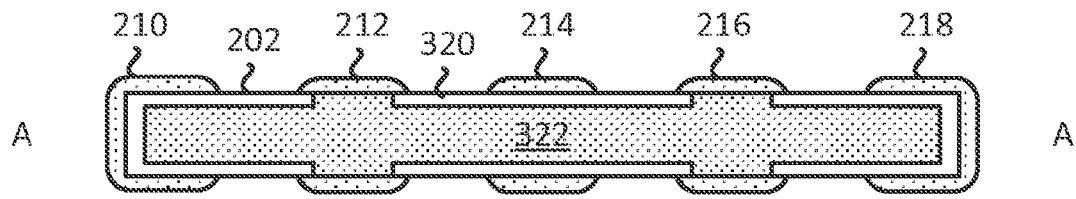
FIG. 4 illustrates an example of a plan view of a cross section of an elongated capacitor.

FIG. 4 illustrates an example of a plan view of cross section AA of the capacitor 200 of FIG. 3. As shown in FIG. 4, the first metal layer 322 is embedded in the dielectric layer 320. The first metal layer 322 has a first design and a first shape. In some implementations, all the first set of metal layers have the same first design and first shape. The first metal layer 322 is coupled (e.g., electrically coupled) to the second terminal 212 and the fourth terminal 216. As further shown in FIG. 4, the first metal layer 322 is not in direct contact (e.g., free of direct contact) with the first terminal 210, the third terminal 214, and the fifth terminal 218.

Figure 5:
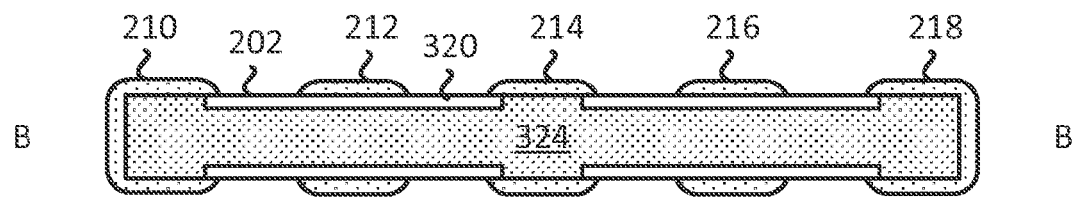
FIG. 5 illustrates an example of a plan view of another cross section of an elongated capacitor.

FIG. 5 illustrates an example of a plan view of cross section BB of the capacitor 200 of FIG. 3. As shown in FIG. 5, the second metal layer 324 is embedded in the dielectric layer 320. The second metal layer 322 has a second design and a second shape. In some implementations, all the second set of metal layers have the same second design and second shape. In some implementations, the second design and second shape are different than the first design and the first shape. The second metal layer 324 is coupled (e.g., electrically coupled) to the first terminal 210, the third terminal 214, and the fifth terminal 218. As further shown in FIG. 4, the second metal layer 324 is not in direct contact (e.g., free of direct contact) with the second terminal 212 and the fourth terminal 216.

FIGS. 2-5 illustrate a capacitor that includes 5 terminals. However, different implementations may use different number of terminals (e.g., 3, 4, 6, 7 terminals, etc. . . . ).

Figure 6:
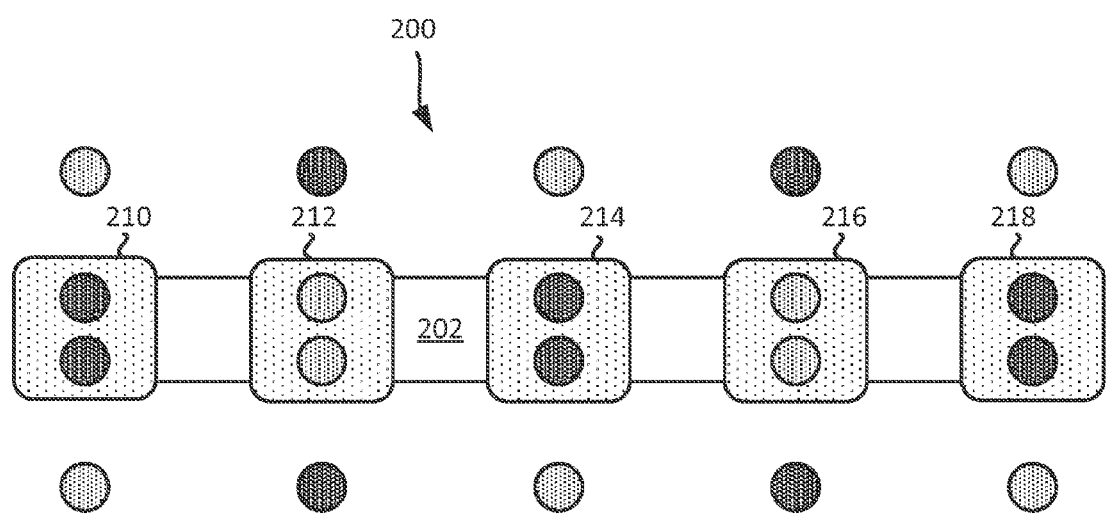
FIG. 6 illustrates an example of a plan view of several electrical paths in an elongated capacitor embedded in a substrate.

FIG. 6 conceptually illustrates how one or more signals may traverse through the capacitor 200. As shown in FIG. 6, a first signal may enter through the second terminal 212 and the fourth terminal 216. The first signal may be one or more power signals. A second signal may exit the capacitor 200 through the first terminal 210, the third terminal 214, and the fifth terminal 218. The second signal may be a ground reference signal. The first signal and/or the second signal may enter or exist through the capacitor 200 through vias (e.g., vias in a substrate) that are coupled to the terminals of the capacitor 200. In some implementations, the dots or circles shown in FIG. 6 represent vias in a substrate (e.g., package substrate, interposer). In some implementations, the polarity of signals may be reversed. For example, the first signal may be a ground reference, and the second signal may be one or more power signals. Also, it should be noted that instead of power signals, the signal may be input/output (I/O) signals. An example of how the capacitor 200 in a substrate is configured to provide an electrical path for signals is further described in at least FIGS. 14-15 below.

One advantage of a capacitor that includes more than two terminals is that it provides lower intrinsic equivalent series inductance (ESL) value compared to two terminal capacitors. The result of lower ESL values for a capacitor is better signal quality and performance, resulting in better performance of an integrated circuit device coupled to the capacitor. Moreover, as will be further described in at least FIGS. 10-12 below, by laterally alternating the polarity of the terminals on the capacitor, there is a lower interconnect inductance between the capacitor and the integrated circuit device, resulting in improved signal quality and performance to and from the integrated circuit device, and overall improvement in the power delivery network (PDN) of the integrated device package.

Exemplary Elongated Capacitor Comprising Equivalent Series Resistance (ESR) Control In some implementations, it may be desirable to control the equivalent series resistance (ESR) values/properties of the capacitor. The ESR property of a capacitor is important because it allows the capacitor to help suppress resonance that may exist in a power delivery network (PDN) of an integrated device package. Different PDNs may require capacitors with different ESR values to suppress the resonance of the PDN.

FIGS. 7-12 illustrate an example of an elongated capacitor 700 that includes configurable ESR values. The capacitor 700 includes a base portion 702, a first terminal 710, a second terminal 712, a third terminal 714, a fourth terminal 716, and a fifth terminal 718. The base portion 702 includes one or more dielectric layers and several metal layers (e.g., metal plates, electrically conductive plates). The first terminal 710, the second terminal 712, the third terminal 714, the fourth terminal 716, and the fifth terminal 718 are conductive materials (e.g., one or more metal layers), where each terminal is coupled (e.g., electrically coupled) to one or more of the metal layers in the base portion 702. In some implementations, externally, the capacitor 700 is similar to the capacitor 200 of FIG. 2. However, internally (e.g., within the base portion 702), the capacitor 700 is different from the capacitor 200.

In some implementations, the capacitor 700 is an elongated multi layer ceramic capacitor (MLCC). In some implementations, the capacitor 700 is embedded in a substrate, such as a packaging substrate and/or an interposer.

Figure 7:
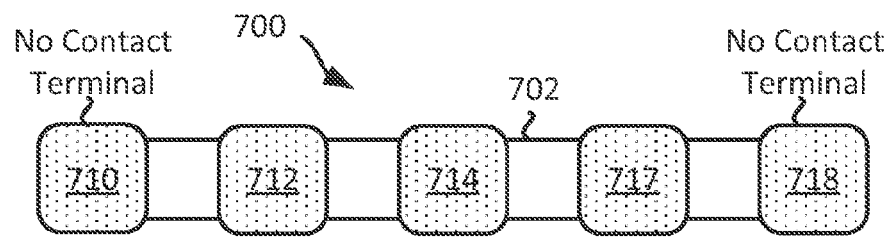
FIG. 7 illustrates an example of an elongated capacitor that includes no contact terminals.
Figure 8:
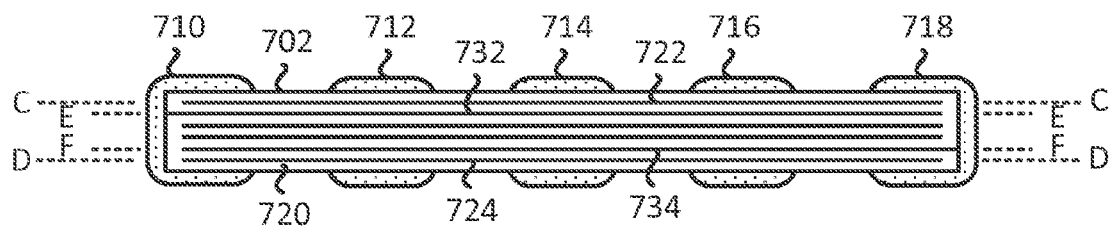
FIG. 8 illustrates an example of a profile view of a cross section of an elongated capacitor that includes no contact terminals.

FIG. 8 illustrates an example of a profile view of a cross section of the capacitor 700 of FIG. 7. As shown in FIG. 8, the base portion 702 of the capacitor 700 includes a dielectric layer 720 and several metal layers (e.g., a first set of metal layers, a second set of metal layers, a third set of metal layers, a fourth set of metal layers). For example, the base portion 702 includes the first metal layer 722, the second metal layer 724, a third metal layer 732, and a fourth metal layer 734. The first metal layer 722 (e.g., first metal plate) is part of a first set of metal layers, the second metal layer 724 (e.g., second metal plate) is part of a second set of metal layers, the third metal layer 732 (e.g., third metal plate) is part of a third set of metal layers, the fourth metal layer 734 (e.g., fourth metal plate) is part of a fourth set of metal layers. Although FIG. 8 illustrates a base portion 702 that includes six (6) metal layers, different implementations may include a different number of metal layers with different configurations and/or combinations of different metal layers.

The first set of metal layers (e.g., first metal layer 722) may be configured to electrically provide a first path for a first signal (e.g., ground reference, power signal, I/O signal). The second set of metal layers (e.g., second metal layer 724) may be configured to electrically provide a second path for a second signal (e.g., ground reference, power signal, I/O signal) that is different than the first signal.

Figure 9:
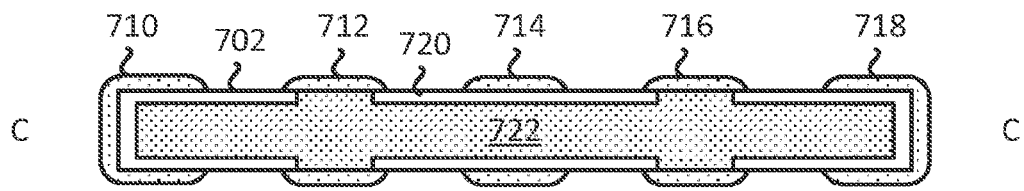
FIG. 9 illustrates an example of a plan view of a cross section of an elongated capacitor that includes no contact terminals.

FIG. 9 illustrates an example of a plan view of cross section CC of the capacitor 700 of FIG. 8. As shown in FIG. 9, the first metal layer 722 is embedded in the dielectric layer 720. The first metal layer 722 has a first design and a first shape. In some implementations, all the first set of metal layers have the same first design and first shape. The first metal layer 722 is coupled (e.g., electrically coupled) to the second terminal 712 and the fourth terminal 716. As further shown in FIG. 9, the first metal layer 722 is not in direct contact (e.g., free of direct contact) with the first terminal 710, the third terminal 714, and the fifth terminal 718.

Figure 10:
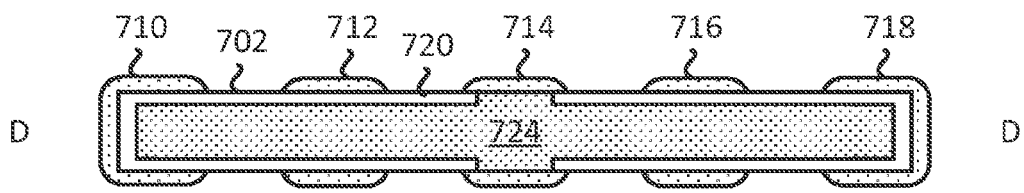
FIG. 10 illustrates an example of a plan view of another cross section of an elongated capacitor that includes no contact terminals.

FIG. 10 illustrates an example of a plan view of cross section DD of the capacitor 700 of FIG. 8. As shown in FIG. 10, the second metal layer 724 is embedded in the dielectric layer 720. The second metal layer 722 has a second design and a second shape. In some implementations, all the second set of metal layers have the same second design and second shape. In some implementations, the second design and second shape are different than the first design and the first shape. The second metal layer 724 is coupled (e.g., electrically coupled) to the third terminal 714. As further shown in FIG. 10, the second metal layer 724 is not in direct contact (e.g., free of direct contact) with the first terminal 710, the second terminal 712, the fourth terminal 716, and the fifth terminal 718.

The third metal layer 732 and the fourth metal layer 734 are configured to provide a resistance in the capacitor. In some implementations, the third metal layer 732 and the fourth metal layer 734 provide the ESR control of the capacitor 700. Thus, by using different configurations and/or combinations of the third metal layer 732 and/or the fourth metal layer 734, a capacitor with different ESR values and/or properties may be achieved. An example of how the capacitor 700 is configured to provide an electrical path for signals is further described in at least FIG. 13 below.

Figure 11:
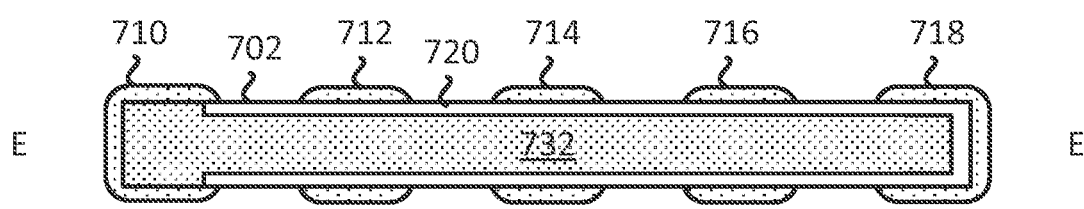
FIG. 11 illustrates an example of a plan view of a cross section of an elongated capacitor that includes no contact terminals.

FIG. 11 illustrates an example of a plan view of cross section EE of the capacitor 700 of FIG. 7. As shown in FIG. 11, the third metal layer 732 is embedded in the dielectric layer 730. The third metal layer 732 has a third design and a third shape. In some implementations, all the third set of metal layers have the same third design and third shape. The third metal layer 732 is optionally coupled to the first terminal 710. As further shown in FIG. 11, the third metal layer 732 is not in direct contact (e.g., free of direct contact) with the second terminal 712, the third terminal 714, the fourth terminal 716 and the fifth terminal 718.

Figure 12:
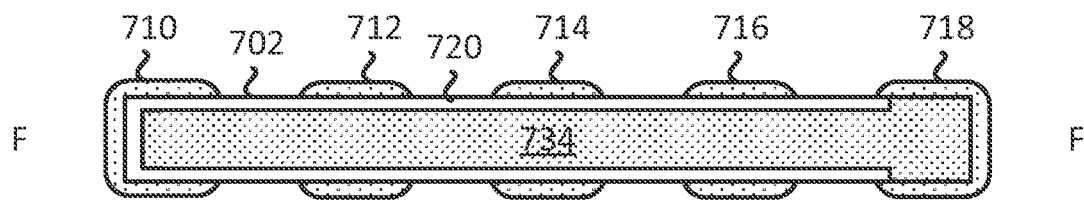
FIG. 12 illustrates an example of a plan view of another cross section of an elongated capacitor that includes no contact terminals.

FIG. 12 illustrates an example of a plan view of cross section FF of the capacitor 700 of FIG. 7. As shown in FIG. 12, the fourth metal layer 734 is embedded in the dielectric layer 730. The fourth metal layer 732 has a fourth design and a fourth shape. In some implementations, all the fourth set of metal layers have the same fourth design and fourth shape. The fourth metal layer 734 is optionally coupled to the fifth terminal 718. As further shown in FIG. 12, the fourth metal layer 734 is not in direct contact (e.g., free of direct contact) with the first terminal 710 the second terminal 712, the third terminal 714, and the fourth terminal 716.

FIGS. 7-12 illustrate a capacitor that includes 5 terminals, including two dummy terminals. However, different implementations may use different number of terminals (e.g., 3, 4, 6, 7 terminals, etc. . . . ). In some implementations, there may more or less than two dummy terminals.

Figure 13:
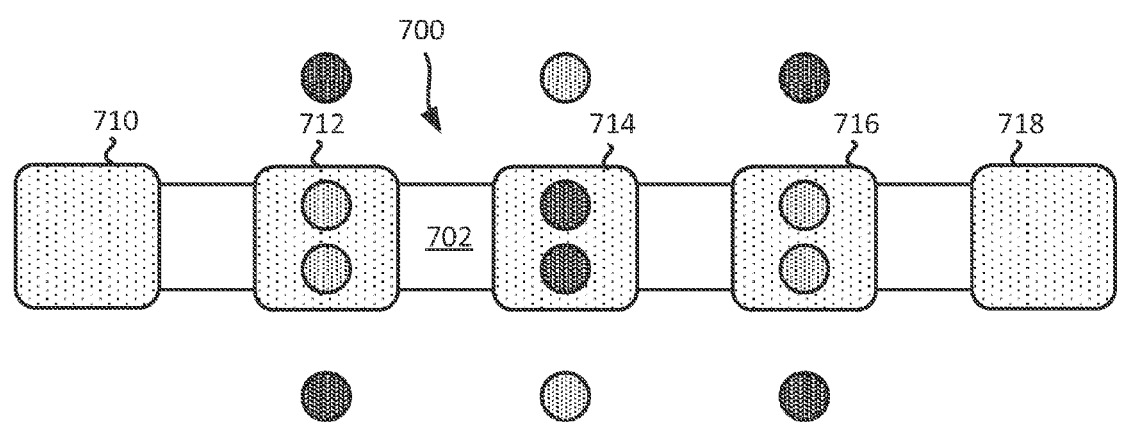
FIG. 13 illustrates an example of a profile view of several electrical paths in an elongated capacitor (that includes no contact terminals) embedded in a substrate.

FIG. 13 conceptually illustrates how one or more signals may traverse through the capacitor 700. As shown in FIG. 13, a first signal may enter through the second terminal 712 and the fourth terminal 716. The first signal may be one or more power signals. A second signal may exit the capacitor 700 through the third terminal. The second signal may be a ground reference signal. The first terminal 710 and the fifth terminal 718 are no contact terminals. That is, when the capacitor 700 is embedded in a substrate, the first terminal 710 and the fifth terminal 718 are not in direct contact with a via and/or a metal layer in the substrate (e.g., package substrate, interposer). The first signal and/or the second signal may enter or exist through the capacitor 700 through vias (e.g., vias in a substrate) that are coupled to the terminals of the capacitor 700. In some implementations, the dots or circles shown in FIG. 13 represent vias in a substrate (e.g., package substrate, interposer). In some implementations, the polarity of signals may be reversed. For example, the first signal may he a ground reference, and the second signal may be one or more power signals. Also, it should be noted that instead of power signals, the signal may be input/output (I/O) signals. An example of how the capacitor 700 in a substrate is configured to provide an electrical path for signals is further described in at least FIGS. 16-17 below.

in some implementations, the capacitor (e.g., capacitor 200, capacitor 700) may be embedded in a substrate, such as a package substrate and/or an interposer.

Exemplary Package Comprising Embedded Elongated Capacitor

Figure 14:
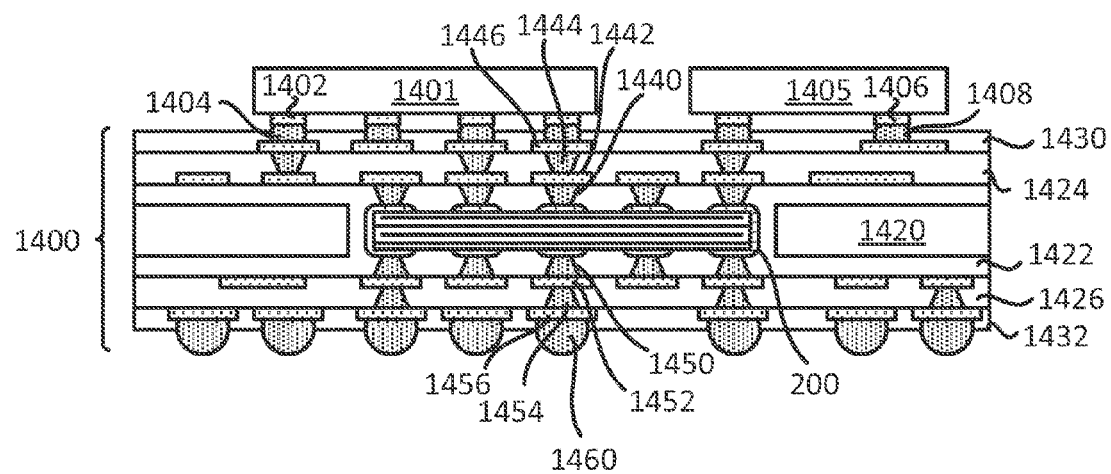
FIG. 14 illustrates an example of a profile view of an elongated capacitor embedded in a substrate.

FIG. 14 illustrates an example of a substrate 1400 that includes the elongated capacitor 200. The substrate 1400 may include a package substrate and/or an interposer. The capacitor 200 includes the base portion 202, the first terminal 210, the second terminal 212, the third terminal 214, the fourth terminal 216, the fifth terminal 218, one or more dielectric layers and several metal layers (e.g., metal plates, electrically conductive plates), as previously described above in FIGS. 2-5.

A first die 1401 (e.g., first integrated device) and a second die 1405 (e.g., first integrated device) are coupled to the substrate 1400. The first die 1401 is coupled to the substrate 1400 through a first set of pillars 1402 and a first set of solder balls 1404. The second die 1405 is coupled to the substrate 1400 through a second set of pillars 1406 and a second set of solder balls 1408. In some implementations, the substrate 1400, the first die 1401, the second die 1405, and the capacitor 200 may form an integrated device package.

As shown in FIG. 14, the capacitor 200 is embedded in the substrate 1400. The substrate 1400 includes a core layer 1420, a first dielectric layer 1422, a second dielectric layer 1424, a third dielectric layer 1426, a first solder resist layer 1430, and a second solder resist layer 1432. The first dielectric layer 1422, the second dielectric layer 1424, and/or the third dielectric layer 1426 may be a prepeg layer. In some implementations, the substrate 1400 is careless. That is, in some implementations, the substrate 1400 does not include the core layer 1420. In some implementations, the core layer 1420 may be replaced with a dielectric layer (e.g., prepeg layer).

The substrate 1400 also includes a first set of vias 1440, a first set of interconnects 1442, a second set of vias 1444, and a second set of interconnects 1446, a third set of vias 1450, a third set of interconnects 1452, a fourth set of vias 1454, and a fourth set of interconnects 1456, and a third set of solder balls 1460. The set of interconnects (e.g., the set of interconnects 1442, 1446, 1452, 1456) may includes traces and pads.

The capacitor 200 is located inside a cavity of the core layer 1420. The capacitor 200 is encapsulated by the first dielectric layer 1422. The first set of vias 1440 is coupled to the terminals (e.g., terminals 210, 212, 214, 216, 218) of the capacitor 200. Similarly, the third set of vias 1450 is coupled to the terminals (e.g., terminals 210, 212, 214, 216, 218) of the capacitor 200. In some implementations, the third set of vias 1450 is coupled to the terminals such that the third set of vias 1450 is located on an opposite side of the first set of vias 1440. The first set of vias 1440 and the third set of vias 1450 are configured to provide a first electrical path and a second electrical path to/from the capacitor 200. An example of first and second electrical paths is further described below in FIG. 15.

As further shown in FIG. 14, the first set of vias 1440 and the third set of vias 1450 are located in the first dielectric layer 1422. The first set of vias 1440 is coupled to the first set of interconnects 1442. The first set of interconnects 1442 is coupled to the second set of vias 1444. The second set of vias 1444 is coupled to the second set of interconnects 1446. The second dielectric layer 1424 encapsulates the first set of interconnects 1442. The second set of vias 1444 is located in the second dielectric layer 1424. The second set of interconnects 1446 is located on the second dielectric layer 1424. Portions of the second set of interconnects 1446 are covered by the first solder resist layer 1430.

The third set of vias 1450 is coupled to the third set of interconnects 1452. The third set of interconnects 1452 is coupled to the fourth set of vias 1454. The fourth set of vias 1454 is coupled to the fourth set of interconnects 1456. The third dielectric layer 1426 encapsulates the third set of interconnects 1452. The fourth set of vias 1454 is located in the third dielectric layer 1426. The fourth set of interconnects 1456 is located on the third dielectric layer 1426. Portions of the fourth set of interconnects 1456 are covered by the second solder resist layer 1432.

Figure 15:
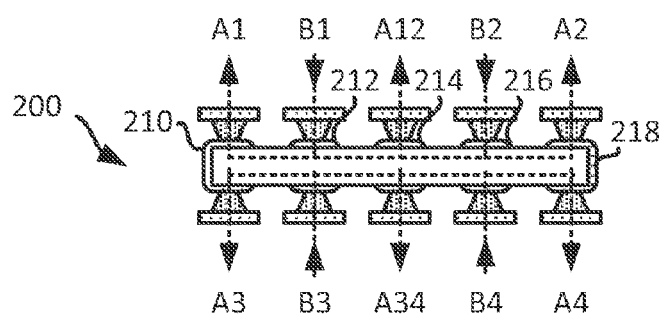
FIG. 15 illustrates an example of a profile view of several electrical paths in an elongated capacitor embedded in a substrate.

FIG. 15 illustrates an example of how one or more signals may traverse the capacitor 200 that is embedded in the substrate 1400. As shown in FIG. 15, a first signal B1 may enter through the second terminal 212, and a second signal B2 may enter through the fourth terminal 216. The first and second signals B1 and B2 may be one or more power signals. Portions of first signal B1 may exit the capacitor 200 through the first terminal 210 and/or the third terminal 214. Portions of second signal B2 may exit the capacitor 200 through the third terminal 214 and/or the fifth terminal 218. The third signal A1 that exits through the first terminal 210 may be a ground reference signal. The fourth signal A2 that exits through the fifth terminal 218 may be a ground reference signal. The fifth signal A12 that exits through the third terminal 214 may be a ground reference signal. The third, fourth, and fifth signals A1, A2, and A12 may be the same ground reference signal.

As further shown in FIG. 15, a third signal B3 may enter through the second terminal 212, and a fourth signal B4 may enter through the fourth terminal 216. The third and fourth signals B3 and B4 may he one or more power signals. Portions of third signal B3 may exit the capacitor 200 through the first terminal 210 and/or the third terminal 214. Portions of fourth signal B4 may exit the capacitor 200 through the third terminal 214 and/or the fifth terminal 218. The fifth signal A3 that exits through the first terminal 210 may be a ground reference signal. The sixth signal A4 that exits through the fifth terminal 218 may be a ground reference signal. The seventh signal A34 that exits through the third terminal 214 may be a ground reference signal. The fifth, sixth, and seventh signals A3, A4, and A34 may be the same ground reference signal. In some implementations, the polarity of the signals may be reversed.

Exemplary Package Comprising Elongated Capacitor With Equivalent Series Resistance (ESR) Control As described above, in some implementations, it may be desirable to control the equivalent series resistance (ESR) values/properties of the capacitor. The ESR property of a capacitor is important because it allows the capacitor to help suppress resonance that may exist in a power delivery network (PDN) of an integrated device package. Different PDNs may require capacitors with different ESR values to suppress the resonance of the PDN.

Figure 16:
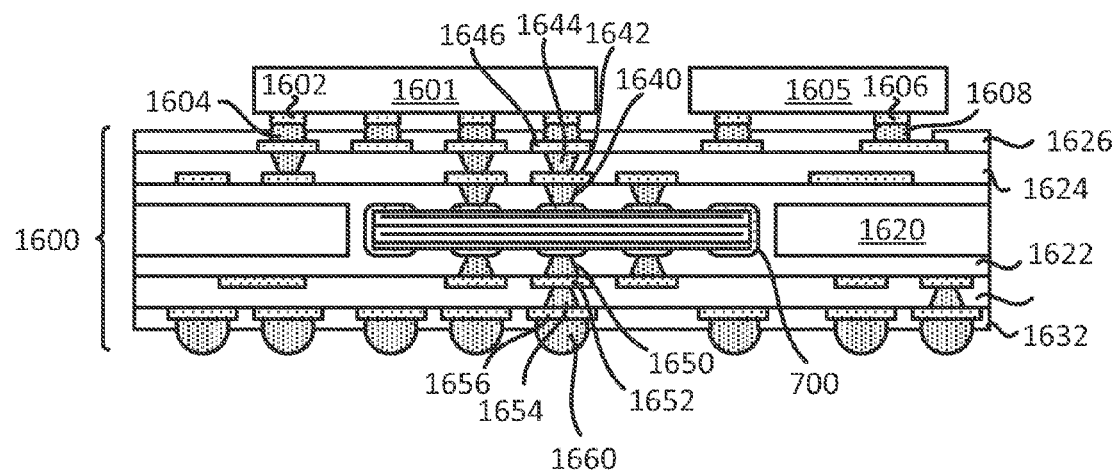
FIG. 16 illustrates an example of a profile view of an elongated capacitor (that includes no contact terminals) embedded in a substrate.

FIG. 16 illustrates an example of a substrate 1600 that includes the elongated capacitor 700. The substrate 1600 may include a package substrate and/or an interposer. The capacitor 700 includes the base portion 702, the first terminal 710, the second terminal 712, the third terminal 714, the fourth terminal 716, the fifth terminal 718, one or more dielectric layers and several metal layers (e.g., metal plates, electrically conductive plates), as previously described above in FIGS. 7-12.

A first die 1601 (e.g., first integrated device) and a second die 1605 (e.g., first integrated device) are coupled to the substrate 1600. The first die 1601 is coupled to the substrate 1600 through a first set of pillars 1602 and a first set of solder balls 1604. The second die 1605 is coupled to the substrate 1600 through a second set of pillars 1606 and a second set of solder balls 1608. In some implementations, the substrate 1600, the first die 1601, the second die 1605, and the capacitor 700 may form an integrated device package.

As shown in FIG. 16, the capacitor 200 is embedded in the substrate 1600. The substrate 1600 includes a core layer 1620, a first dielectric layer 1622, a second dielectric layer 1624, a third dielectric layer 1626, a first solder resist layer 1630, and a second solder resist layer 1632. The first dielectric layer 1622, the second dielectric layer 1624, and/or the third dielectric layer 1626 may be a prepeg layer. In some implementations, the substrate 1600 is coreless. That is, in some implementations, the substrate 1600 does not include the core layer 1620. In some implementations, the core layer 1620 may be replaced with a dielectric layer (e.g., prepeg layer).

The substrate 1600 also includes a first set of vias 1640, a first set of interconnects 1642, a second set of vias 1644, and a second set of interconnects 1646, a third set of vias 1650, a third set of interconnects 1652, a fourth set of vias 1654, and a fourth set of interconnects 1656, and a third set of solder balls 1660. The set of interconnects (e.g., the set of interconnects 1642, 1646, 1652, 1656) may includes traces and pads.

The capacitor 700 is located inside a cavity of the core layer 1620. The capacitor 700 is encapsulated by the first dielectric layer 1622. The first set of vias 1640 is coupled to the terminals (e.g., terminals 712, 714, 716) of the capacitor 700. Similarly, the third set of vias 1650 is coupled to the terminals (e.g., terminals 712, 714, 716) of the capacitor 700. It should be noted that the first terminal 710 and the fifth terminal 718 of the capacitor 700 are no contact terminals. That is, the first terminal 710 and the fifth terminal 718 of the capacitor 700 are not in direct contact (e.g., free of direct contact) with an interconnect (e.g., via) that is configured to provide an electrical path for a signal. In some implementations, the first and fifth terminals 710 and 718 are dummy terminals. In such instances, no signal (e.g., power signal, ground signal, I/O signal) traverses through the first and fifth terminals 710 and 718.

In some implementations, the third set of vias 1650 is coupled to the terminals such that the third set of vias 1650 is located on an opposite side of the first set of vias 1640. The first set of vias 1640 and the third set of vias 1650 are configured to provide a first electrical path and a second electrical path to/from the capacitor 700. An example of first and second electrical paths is further described below in FIG. 17.

As further shown in FIG. 16, the first set of vias 1640 and the third set of vias 1650 are located in the first dielectric layer 1622. The first set of vias 1640 is coupled to the first set of interconnects 1642. The first set of interconnects 1642 is coupled to the second set of vias 1644. The second set of vias 1644 is coupled to the second set of interconnects 1646. The second dielectric layer 1624 encapsulates the first set of interconnects 1642. The second set of vias 1644 is located in the second dielectric layer 1624. The second set of interconnects 1646 is located on the second dielectric layer 1624. Portions of the second set of interconnects 1646 are covered by the first solder resist layer 1630.

The third set of vias 1650 is coupled to the third set of interconnects 1652. The third set of interconnects 1652 is coupled to the fourth set of vias 1654. The fourth set of vias 1654 is coupled to the fourth set of interconnects 1656. The third dielectric layer 1626 encapsulates the third set of interconnects 1652. The fourth set of vias 1654 is located in the third dielectric layer 1626. The fourth set of interconnects 1656 is located on the third dielectric layer 1626. Portions of the fourth set of interconnects 1656 are covered by the second solder resist layer 1632.

Figure 17:
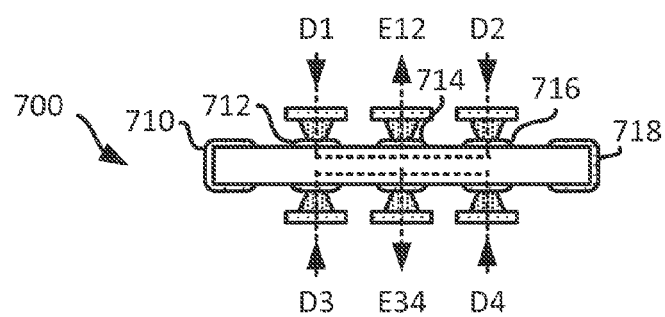
FIG. 17 illustrates an example of a plan view of several electrical paths in an elongated capacitor (that includes no contact terminals) embedded in a substrate.

FIG. 17 illustrates an example of how one or more signals may traverse the capacitor 700 that is embedded in the substrate 1600. As shown in FIG. 17, a first signal D1 may enter through the second terminal 712, and a second signal D2 may enter through the fourth terminal 716. The first and second signals D1 and D2 may be one or more power signals. At least a portion of first signal D1 may exit the capacitor 700 through the third terminal 714. At least a portion of second signal D2 may exit the capacitor 700 through the third terminal 714. The third signal E12 that exits through the third terminal 714 may be a ground reference signal.

As further shown in FIG. 17, a third signal D3 may enter through the second terminal 712, and a fourth signal D4 may enter through the fourth terminal 716. The third and fourth signals D3 and D4 may be one or more power signals. At least a portion of third signal E34 may exit the capacitor 700 through the third terminal 714. At least a portion of fourth signal D4 may exit the capacitor 700 through the third terminal 714. The fifth signal E34 that exits through the third terminal 714 may be a ground reference signal. In some implementations, the polarity of the signals may be reversed.

As shown in FIG. 17, the first and fifth terminals 710 and 718 are dummy terminals. In such instances, no signal (e.g., power signal, ground signal, I/O signal) traverses through the first and fifth terminals 710 and 718.

Exemplary Package Comprising Embedded Elongated Capacitor

Figure 18:
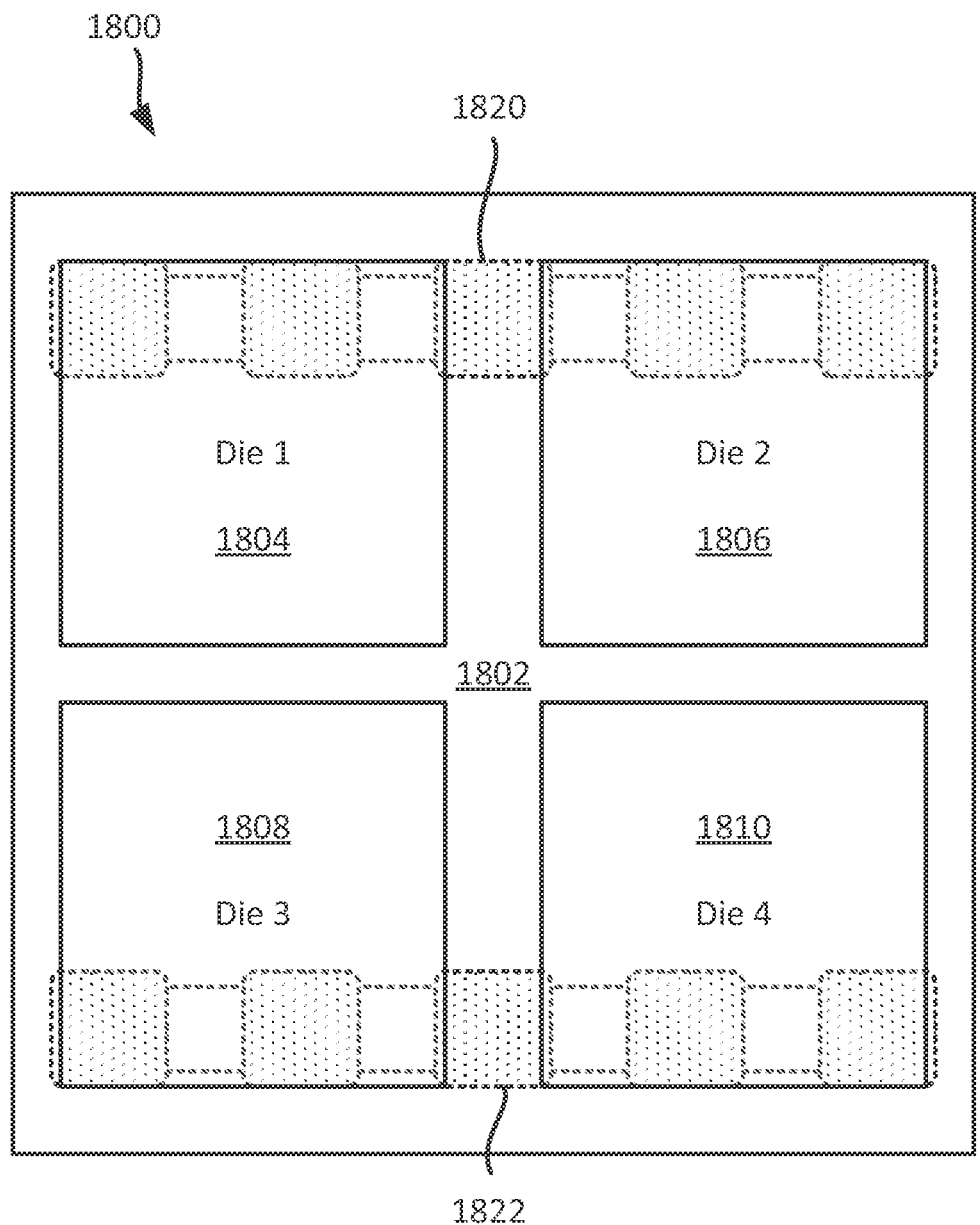
FIG. 18 illustrates an example of a plan view of an elongated capacitor embedded in a substrate coupled to several dies.

FIG. 18 illustrates an example of a plan view (e.g., top view) of a package substrate 1800 that includes a substrate 1802, several dies, and several embedded elongated capacitors. The substrate 1400 may include a package substrate and/or an interposer.

As shown in FIG. 18, a first die 1804, a second die 1806, a third die 1808 and a fourth die 1810 are coupled (e.g., mounted on top) to the substrate 1802. A first capacitor 1820 and a second capacitor 1822 are embedded in the substrate 1802. The first and second capacitors 1820 and 1822 may include the capacitors 200 and/or 700, as previously described above.

As further shown in FIG. 18, the first capacitor 1820 is embedded in the substrate 1802 such that the first capacitor 1820 is aligned along a first side of the first die 1804 and the second die 1806. Similarly, the second capacitor 1822 is embedded in the substrate 1802 such that the second capacitor 1822 is aligned along a second side of the third die 1808 and the fourth die 1810.

Exemplary Sequence for Providing/Fabricating an Elongated Capacitor

Figure 19:
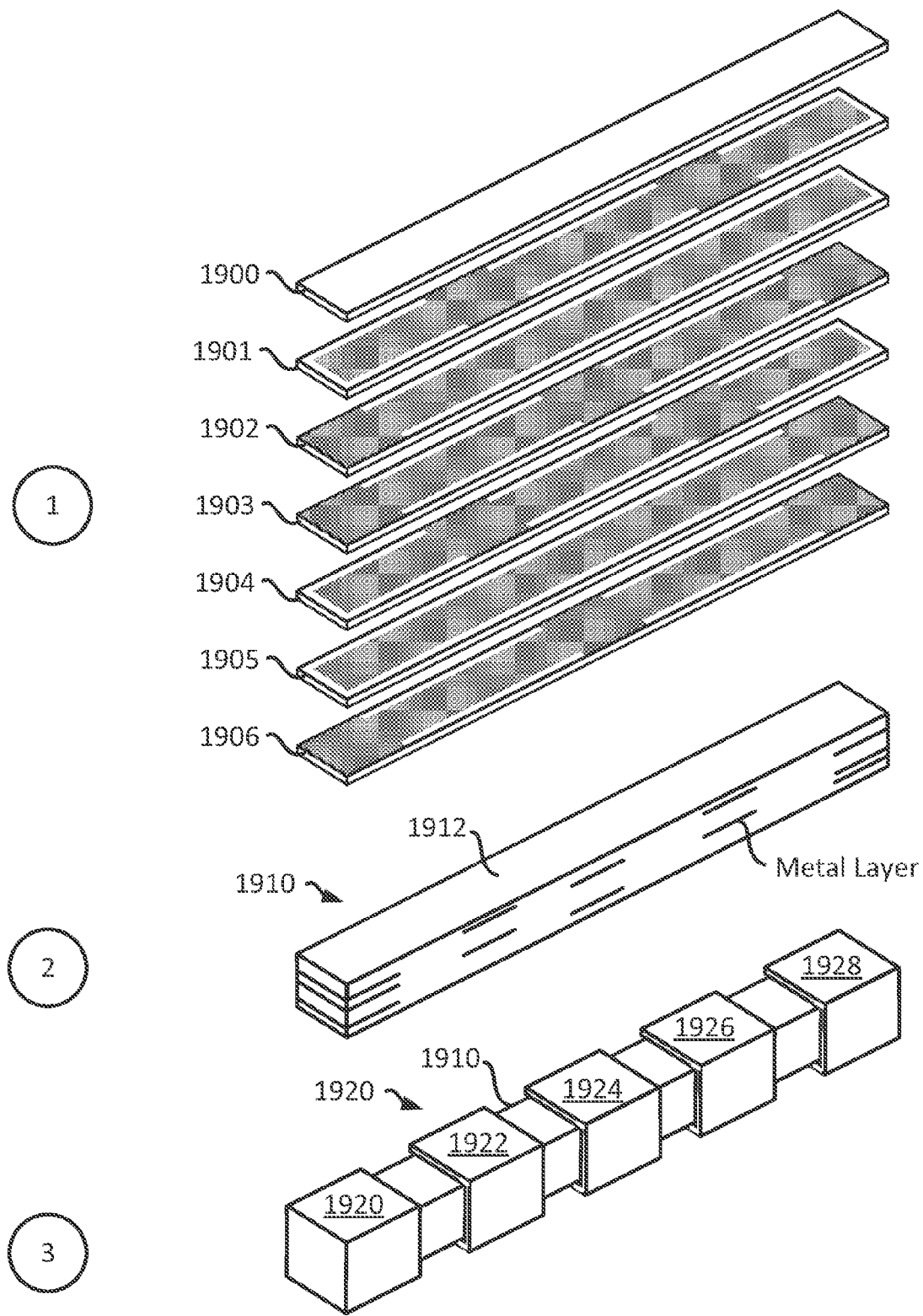
FIG. 19 illustrates an exemplary sequence for providing/fabricating an elongated capacitor.

In some implementations, providing/fabricating an elongated capacitor includes several processes. FIG. 19 illustrates an exemplary sequence for providing/fabricating an elongated capacitor. In some implementations, the sequence of FIG. 19 may be used to provide/fabricate the capacitors of FIGS. 2, 7 and/or other capacitors in the present disclosure. However, for the purpose of simplification, FIG. 19 will be described in the context of providing/fabricating the capacitor of FIGS. 7-12.

It should be noted that the sequence of FIG. 19 may combine one or more stages in order to simplify and/or clarify the sequence for providing a capacitor. In some implementations, the order of the processes may be changed or modified.

Stage 1 illustrates a state after several sheets (e.g., sheets 1900-1906) are provided. Some of the sheets include a dielectric layer (e.g., ceramic layer) and a metal layer. Different sheets may include a metal layer with a different pattern design. In some implementations, the metal layer is formed on the dielectric layer using a screen printing process.

Stage 2 illustrates a state after the several sheets (e.g., sheets 1900-1906) are combined (e.g., laminated together) to form a base portion 1910. The base portion 1910 includes a dielectric layer 1912 and several metal layers (e.g., several metal plates, several conducting layers). In some implementations, the dielectric layer 1912 is a combination of some or all of the dielectric layers of the sheets 1900-1906.

Stage 3 illustrates a state after several terminals (e.g., terminals 1920, 1922, 1924, 1926, 1928) are formed on the base portion 1910. In some implementations, a plating process is used to form the terminals on the base portion 1910. In some implementations, each terminal may include one or more conductive layers (e.g., one or more metal layers). In some implementations, the first terminal 1920 and the fifth terminal 1928 are dummy terminals. The terminals (e.g., terminals 1920, 1922, 1924, 1926, 1928) are formed around all the surfaces (e.g., first surface, second surface) of the base portion 1910. However, in some implementations, the terminals may be formed on only some of the surfaces of the base portion 1910.

Exemplary Method for Providing Fabricating an Elongated Capacitor

Figure 20:
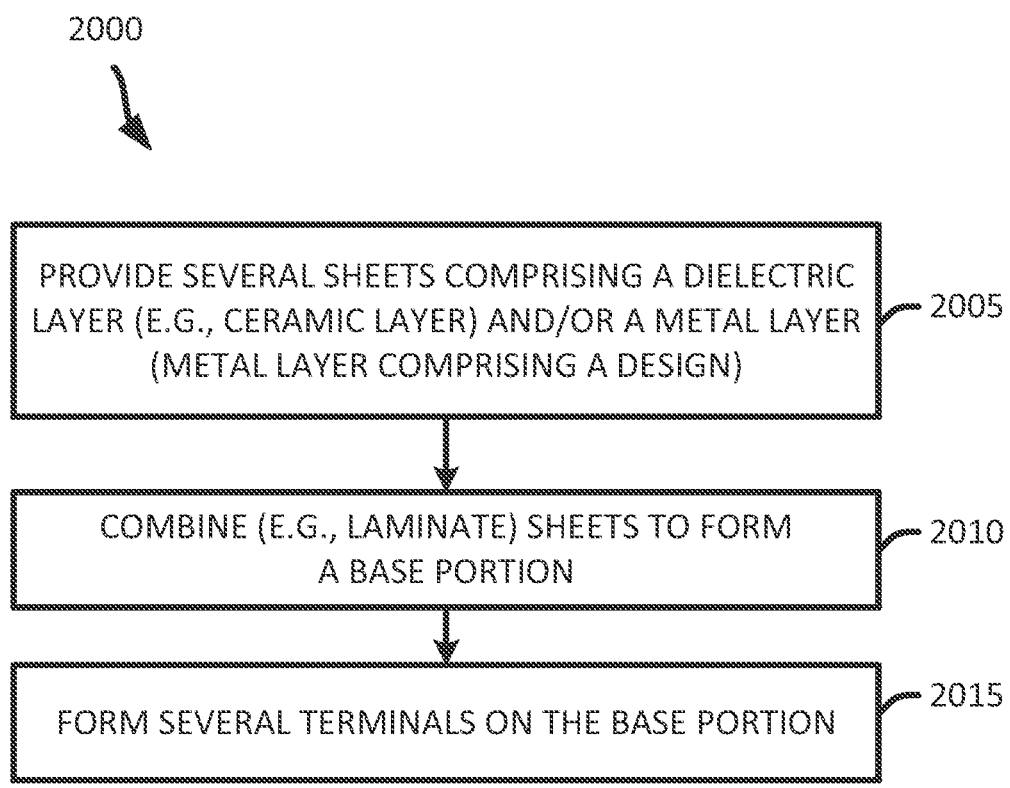
FIG. 20 illustrates an exemplary flow diagram of a method for providing/fabricating an elongated capacitor.

FIG. 20 illustrates an exemplary flow diagram of a method 2000 for providing/fabricating an elongated capacitor. In some implementations, the method of FIG. 20 may be used to provide/fabricate the elongated capacitors of FIG. 2, 7 and/or other capacitors in the present disclosure.

It should be noted that the flow diagram of FIG. 20 may combine one or more step and/or processes in order to simplify and/or clarify the method for providing an integrated device package. In some implementations, the order of the processes may be changed or modified.

The method provides (at 2005) several sheets (e.g., sheets 1900-1906). Some of the sheets include a dielectric layer (e.g., ceramic layer) and a metal layer. Different sheets may include a metal layer with a different pattern design. In some implementations, the metal layer is formed on the dielectric layer using a screen printing process.

The method combines (at 2010) the sheets (e.g., sheets 1900-1906) to form a base portion (e.g., base portion 1910). The base portion includes a dielectric layer and several metal layers (e.g., several metal plates, several conducting layers). In some implementations, the dielectric layer is a combination of some or all of the dielectric layers of the sheets 1900-1906.

The method forms (at 2015) several terminals (e.g., terminals 1920, 1922, 1924, 1926, 1928) on the base portion. In some implementations, a plating process is used to form the terminals on the base portion. In some implementations, each terminal may include one or more conductive layers (e.g., one or more metal layers). In some implementations, the first terminal and the fifth terminal are dummy terminals. The terminals are formed around all the surfaces of the base portion. However, in some implementations, the terminals may be formed on only some of the surfaces of the base portion.

Exemplary Sequence for Providing/Fabricating a Substrate Comprising a Capacitor

In some implementations, providing/fabricating a substrate comprising a capacitor includes several processes. FIG. 21 (which includes FIGS. 21A-21C) illustrates an exemplary sequence for providing/fabricating a substrate comprising a capacitor. In some implementations, the sequence of FIGS. 21A-21C may be used to provide/fabricate the substrates of FIGS. 14, 16 and/or other substrates in the present disclosure. However, for the purpose of simplification, FIGS. 21A-21C will be described in the context of providing/fabricating the substrate of FIG. 14.

Figure 21A:
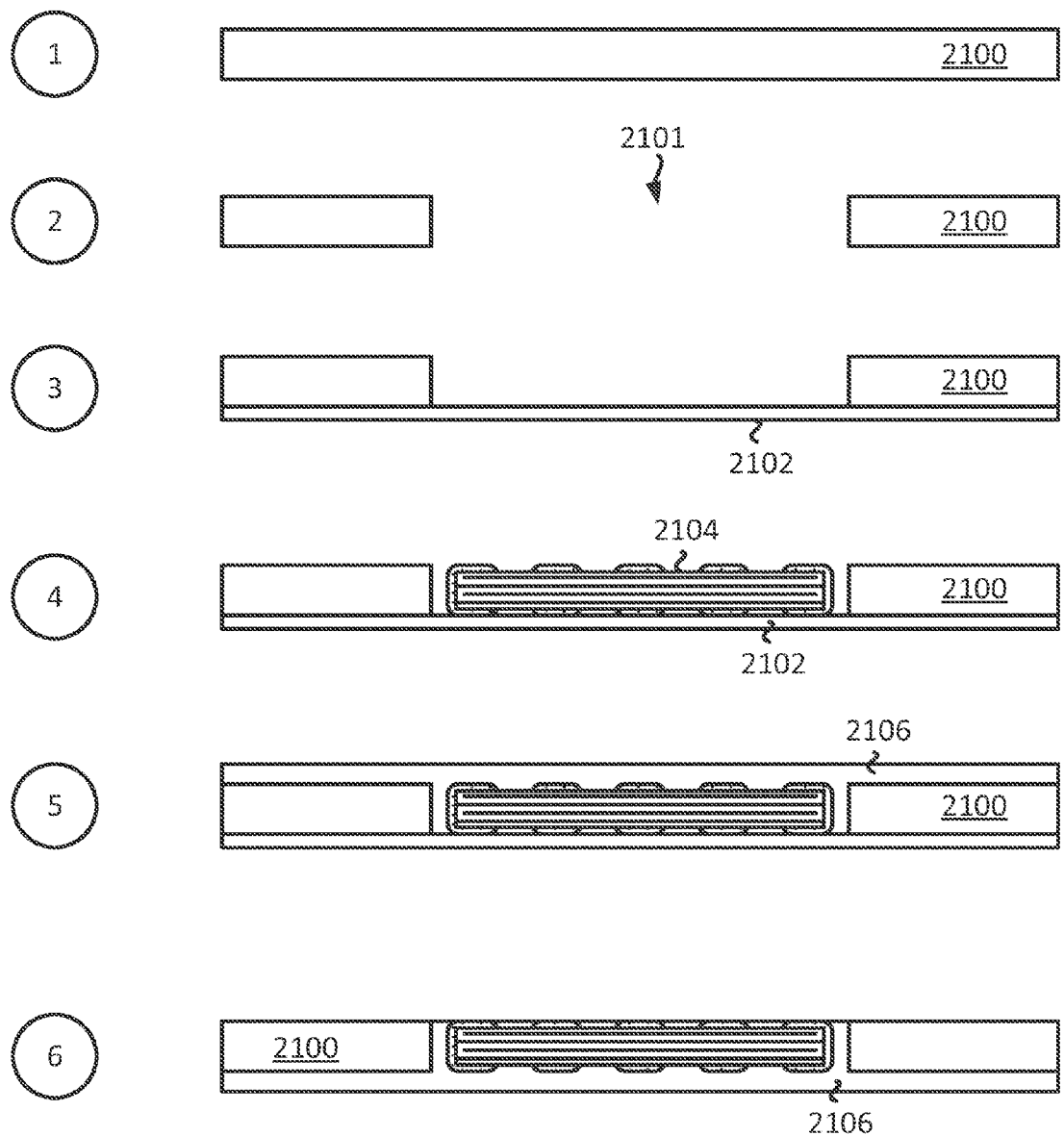
FIG. 21 (comprising FIGS. 21A-21C) illustrates an exemplary sequence for providing/fabricating a substrate that includes an embedded elongated capacitor.
Figure 21B:
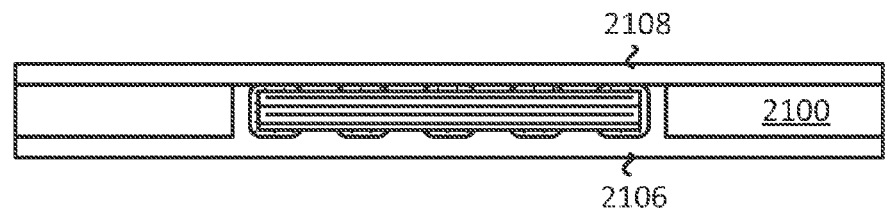
Figure 21B:
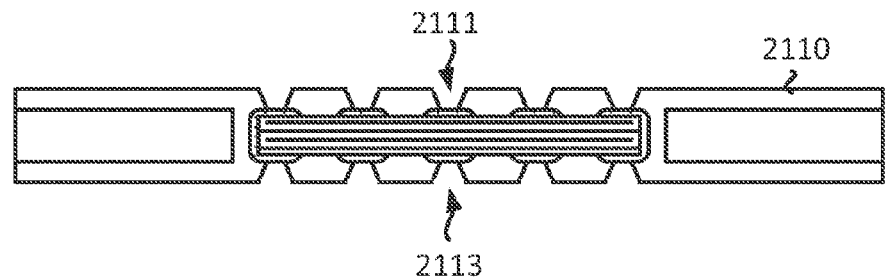
Figure 21B:
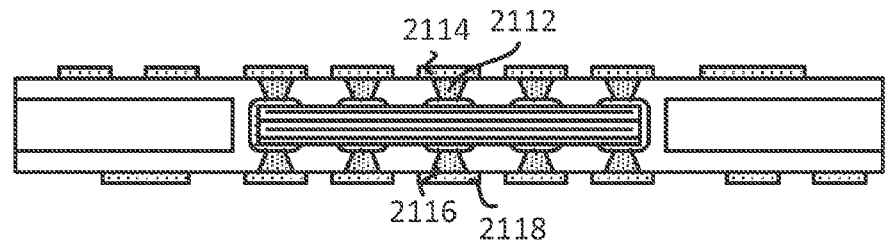
Figure 21B:
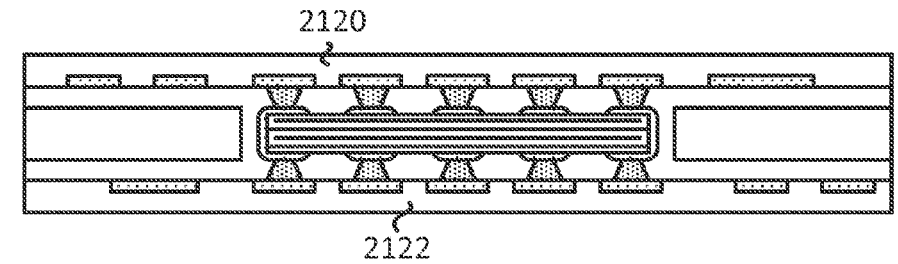
Figure 21C:
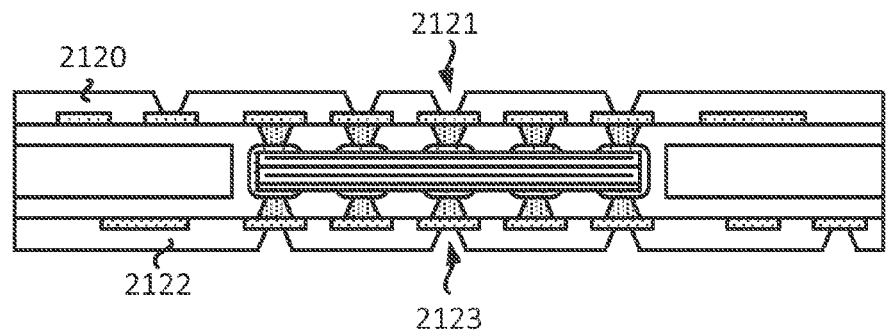
Figure 21C:
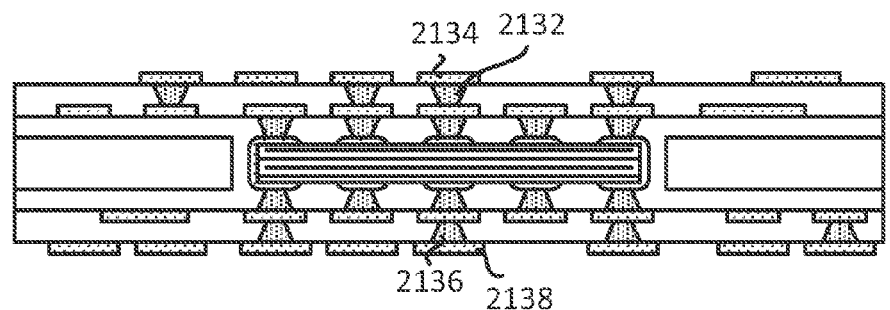
Figure 21C:
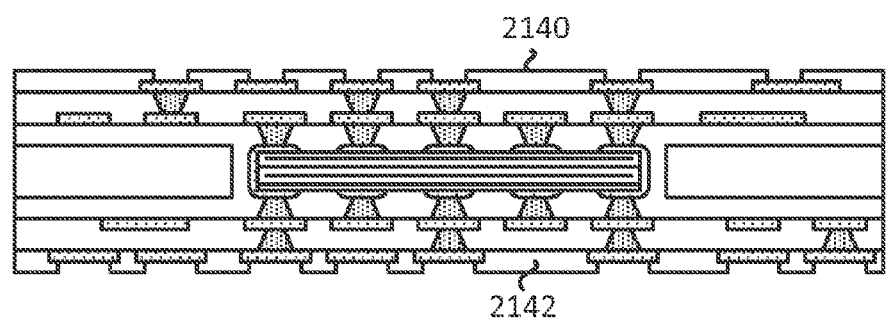

It should be noted that the sequence of FIGS. 21A-21C may combine one or more stages in order to simplify and/or clarify the sequence for providing a substrate. In some implementations, the order of the processes may be changed or modified.

Stage 1 of FIG. 21A, illustrates a state after a core layer 2100 is provided. The core layer 2100 may be a dielectric layer and/or a substrate (e.g., silicon substrate).

Stage 2 illustrates a state after a cavity 2101 is formed in the core layer 2100. Different implementations may use different processes to form the cavity 2101. In some implementations, the cavity 2101 is formed by using a laser and/or photo etching process.

Stage 3 illustrates a state after the core layer 2100 is coupled to a carrier 2102. In some implementations, the carrier 2102 is a substrate.

Stage 4 illustrates a state after a capacitor 2104 is positioned on the carrier 2102 in the cavity 2101 of the core layer 2100. Different implementations may use different capacitors. In some implementations, the capacitor 2104 is identical or similar to the capacitors 200 or 700 as described above.

Stage 5 illustrates a state after a first dielectric layer 2106 is formed on a first surface (e.g., top surface) of the core layer 2100 and the capacitor 2104. The first dielectric layer 2106 fills the cavity 2101 and encapsulates the capacitor 2104.

Stage 6 illustrates a state after the carrier 2102 is removed, leaving the core layer 2100, the capacitor 2104 and the first dielectric layer 2106.

Stage 7 of FIG. 21B, illustrates a state after a second dielectric layer 2108 is formed on a second surface (e.g., bottom surface) of the core layer 2100, the first dielectric layer 2106, and the capacitor 2104, in some implementations, the second dielectric layer 2108 and the first dielectric layer 2106 are the same dielectric layer. In some implementations, the dielectric layers 2106, 2108 and/or 2110 is a photo-etchable dielectric layer.

Stage 8 illustrates a state after a first cavity 2111 and a second cavity 2113 are formed in the dielectric layer 2110. In some implementations, the dielectric layer 2110 is a combination of the first dielectric layer 2106 and the second dielectric layer 2108. Different implementations may use different processes to form the cavities 2111 and 2113. In some implementations, the cavities 2111 and 2113 are formed by using a laser and/or photo etching process. The cavities 2111 and 2113 are formed over the terminals of the capacitor 2104.

Stage 9 illustrates a state after a first set of vias 2112, a first set of interconnects 2114 (e.g., traces, pads), a second set of vias 2116, and a second set of interconnects 2118 (e.g., traces, pads) are formed in/on the dielectric layer 2110. Different implementations may use different processes to form the interconnects and/or vias. Various examples of forming interconnects (e.g., vias, traces, pads) are further described below in FIGS. 23-26.

Stage 10 illustrates a state after a third dielectric layer 2120 and a fourth dielectric layer 2122 are formed. The third dielectric layer 2120 is formed over the first set of interconnects 2114. The fourth dielectric layer 2122 is formed over the second set of interconnects 2118.

Stage 11 of FIG. 21C illustrates a state after a third cavity 2121 is formed in the third dielectric layer 2120, and a fourth cavity 2123 is formed in the fourth dielectric layer 2122. Different implementations may use different processes to form the cavities 2121 and 2123. In some implementations, the cavities 2121 and 2123 are formed by using a laser and/or photo etching process.

Stage 12 illustrates a state after a third set of vias 2132 and a third set of interconnects 2134 (e.g., traces, pads) are formed in/on the third dielectric layer 2120, and a fourth set of vias 2136 and a fourth set of interconnects 2138 (e.g., traces, pads) are formed in/on the fourth dielectric layer 2122. Different implementations may use different processes to form the interconnects and/or vias. Various examples of forming interconnects (e.g., vias, traces, pads) are further described below in FIGS. 23-26.

Stage 13 illustrates a state after a first solder resist layer 2140 and a second solder resist layer 2142 are formed. As shown, the first solder resist layer 2140 is formed over the third dielectric layer 2120, and the second solder resist layer 2142 is formed over the fourth dielectric layer 2122.

Exemplary Method for Providing/Fabricating a Substrate Comprising a Capacitor

Figure 22:
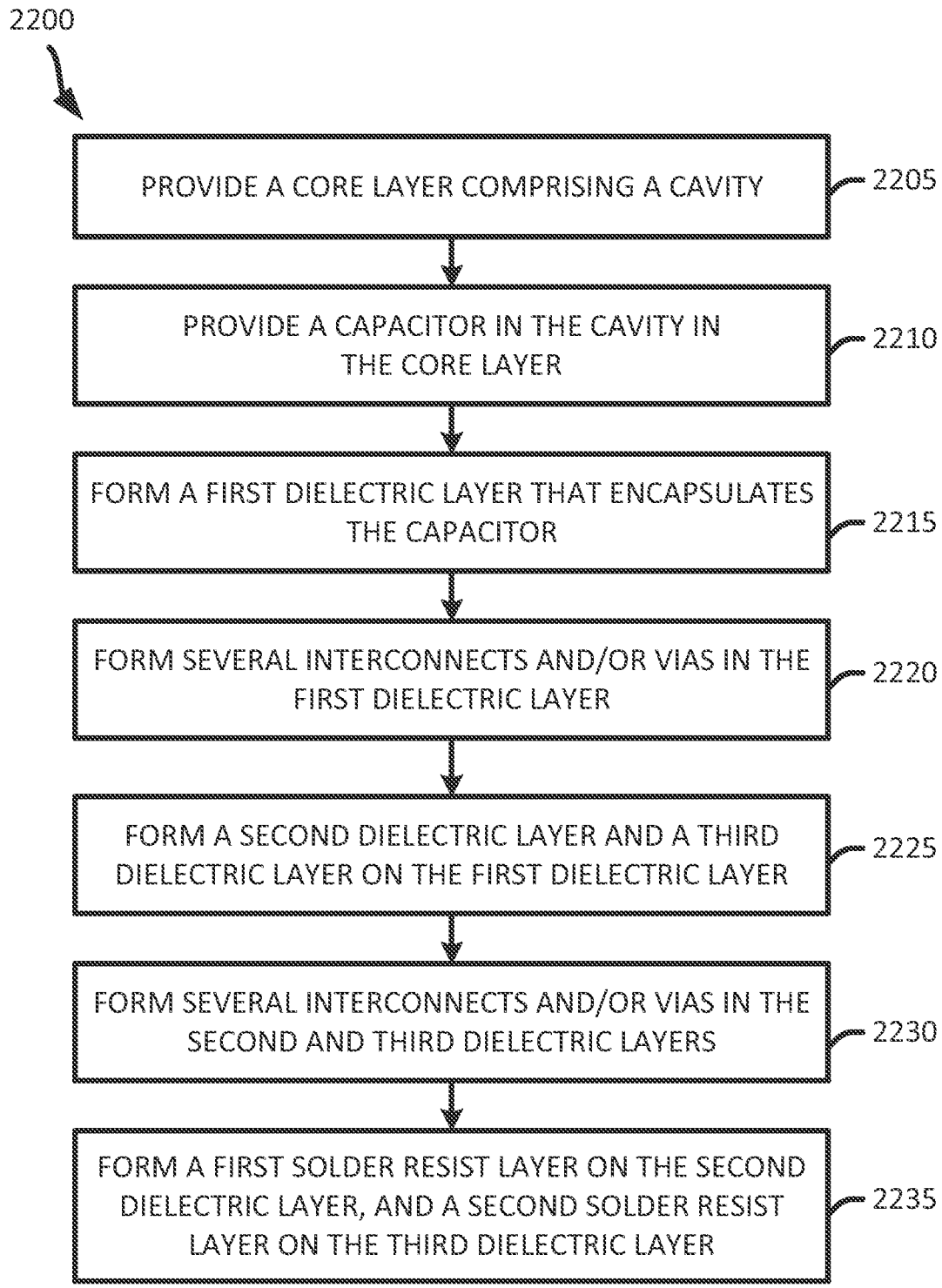
FIG. 22 illustrates an exemplary flow diagram of a method for providing/fabricating a substrate that includes an embedded elongated capacitor.

FIG. 22 illustrates an exemplary flow diagram of a method 2200 for providing/fabricating a substrate comprising a capacitor. In some implementations, the method of FIG. 22 may be used to provide/fabricate the substrate comprising a capacitor of FIGS. 14, 16 and/or other substrates in the present disclosure.

It should be noted that the flow diagram of FIG. 22 may combine one or more step and/or processes in order to simplify and/or clarify the method for providing a substrate. In some implementations, the order of the processes may be changed or modified.

The method provides (at 2205) a core layer that includes a cavity. The core layer may be a dielectric layer and/or a substrate (e.g., silicon substrate). In some implementations, providing a core layer that includes a cavity includes forming a core layer, forming a cavity in the core layer and coupling the core layer to a carrier. Different implementations may use different processes to form the cavity. In some implementations, the cavity is formed by using a laser and/or photo etching process.

The method positions (at 2210) a capacitor in the cavity of the core layer. Different implementations may use different capacitors. In some implementations, the capacitor is identical or similar to the capacitors 200 or 700 as described above.

The method forms (at 2215) a first dielectric layer that encapsulates the capacitor. In some implementations, the first dielectric layer may include several dielectric layers.

The method forms (at 2220) several interconnects and/or vias in the first dielectric layer. The vias are coupled to terminals in the capacitors. Different implementations may use different processes to form the interconnects and/or vias. Various examples of forming interconnects (e.g., vias, traces, pads) are further described below in FIGS. 23-26.

The method forms (at 2225) a second dielectric layer and a third dielectric layer. The second dielectric layer is formed on a first surface of the first dielectric layer. The third dielectric layer is formed on a second surface of the first dielectric layer.

The method forms (at 2230) several interconnects and/or vias in the second and third dielectric layers. Different implementations may use different processes to form the interconnects and/or vias. Various examples of forming interconnects (e.g., vias, traces, pads) are further described below in FIGS. 23-26.

The method forms (at 2235) a first solder resist layer on the second dielectric layer, and a second solder resist layer on the third dielectric layer.

Exemplary Semi-Additive Patterning (SAP) Process

Various interconnects (e.g., traces, vias, pads) are described in the present disclosure. These interconnects may be formed in the package substrate and/or the redistribution portion of the integrated device package. In some implementations, these interconnects may includes one or more metal layers. For example, in some implementations, these interconnects may include a first metal seed layer and a second metal layer. The metal layers may be provided (e.g., formed) using different plating processes. Below are detailed examples of interconnects (e.g., traces, vias, pads) with seed layers and how these interconnects may be formed using different plating processes.

Different implementations may use different processes to form and/or fabricate the metal layers (e.g., interconnects, redistribution layer, under hump metallization layer, protrusion). In some implementations, these processes include a semi-additive patterning (SAP) process and a damascene process. These various different processes are further described below.

Figure 23:
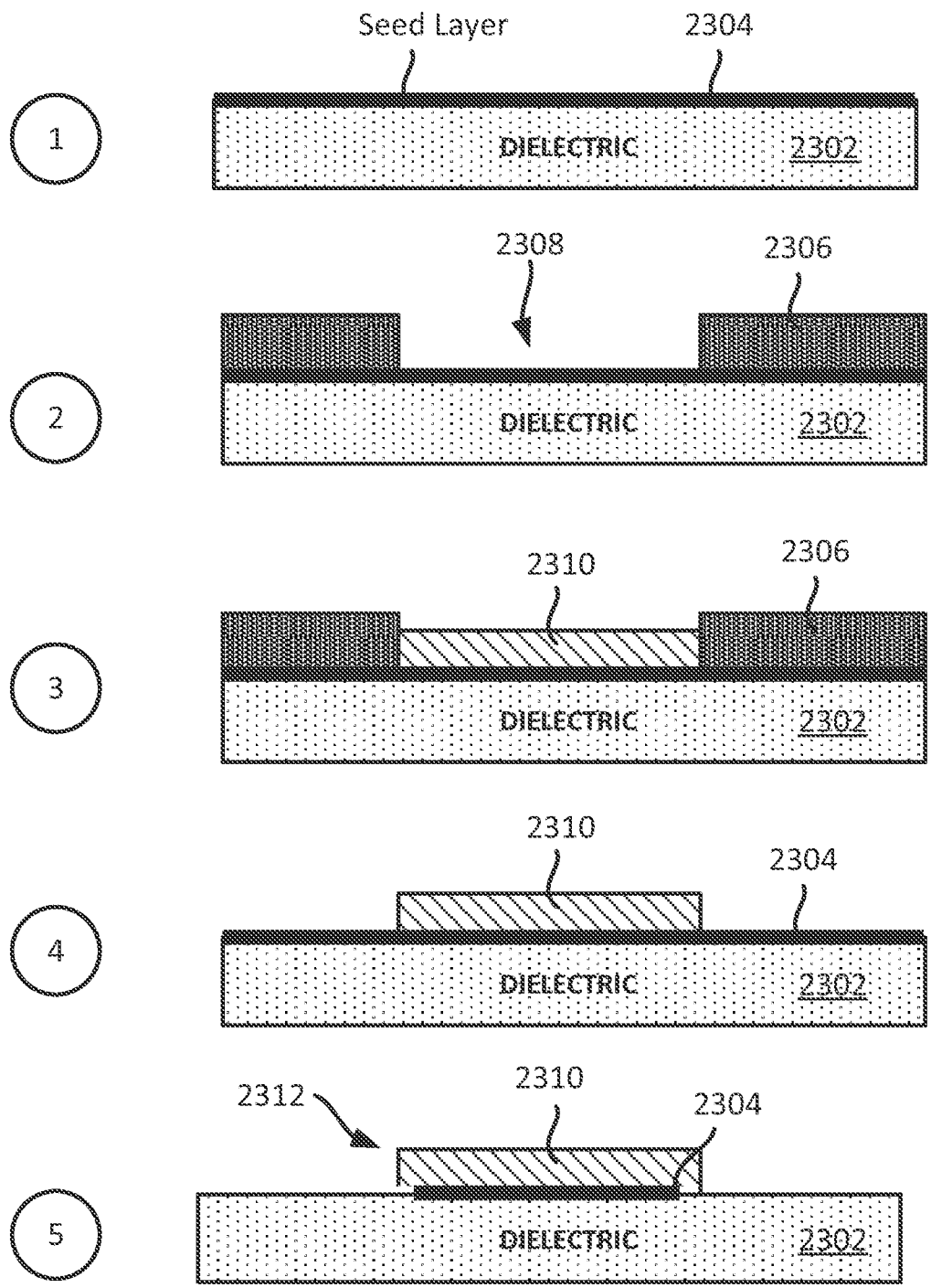
FIG. 23 illustrates an example of a semi-additive patterning (SAP) process.

FIG. 23 illustrates a sequence for forming an interconnect using a semi-additive patterning (SAP) process to provide and/or form an interconnect in one or more dielectric layer(s). As shown in FIG. 23, stage 1 illustrates a state of an integrated device (e.g., substrate) after a dielectric layer 2302 is provided (e.g., formed). In some implementations, stage 1 illustrates that the dielectric layer 2302 includes a first metal layer 2304. The first metal layer 2304 is a seed layer in some implementations. In some implementations, the first metal layer 2304 may be provided (e.g., formed) on the dielectric layer 2302 after the dielectric layer 2302 is provided (e.g., received or formed). Stage 1 illustrates that the first metal layer 2304 is provided (e.g., formed) on a first surface of the dielectric layer 2302. In some implementations, the first metal layer 2304 is provided by using a deposition process (e.g., PVD, CVD, plating process).

Stage 2 illustrates a state of the integrated device after a photo resist layer 2306 (e.g., photo develop resist layer) is selectively provided (e.g., formed) on the first metal layer 2304. In some implementations, selectively providing the resist layer 2306 includes providing a first resist layer 2306 on the first metal layer 2304 and selectively removing portions of the resist layer 2306 by developing (e.g., using a development process). Stage 2 illustrates that the resist layer 2306 is provided such that a cavity 2308 is formed.

Stage 3 illustrates a state of the integrated device after a second metal layer 2310 is formed in the cavity 2308. In some implementations, the second metal layer 2310 is formed over an exposed portion of the first metal layer 2304. In some implementations, the second metal layer 2310 is provided by using a deposition process (e.g., plating process).

Stage 4 illustrates a state of the integrated device after the resist layer 2306 is removed. Different implementations may use different processes for removing the resist layer 2306.

Stage 5 illustrates a state of the integrated device after portions of the first metal layer 2304 are selectively removed. In some implementations, one or more portions of the first metal layer 2304 that is not covered by the second metal layer 2310 is removed. As shown in stage 5, the remaining first metal layer 2304 and the second metal layer 2310 may form and/or define an interconnect 2312 (e.g., trace, vias, pads) in an integrated device and/or a substrate. In some implementations, the first metal layer 2304 is removed such that a dimension (e.g., length, width) of the first metal layer 2304 underneath the second metal layer 2310 is smaller than a dimension (e.g., length, width) of the second metal layer 2310, which can result in an undercut, as shown at stage 5 of FIG. 23. In some implementations, the above mentioned processes may be iterated several times to provide and/or form several interconnects in one or more dielectric layers of an integrated device and/or substrate.

Figure 24:
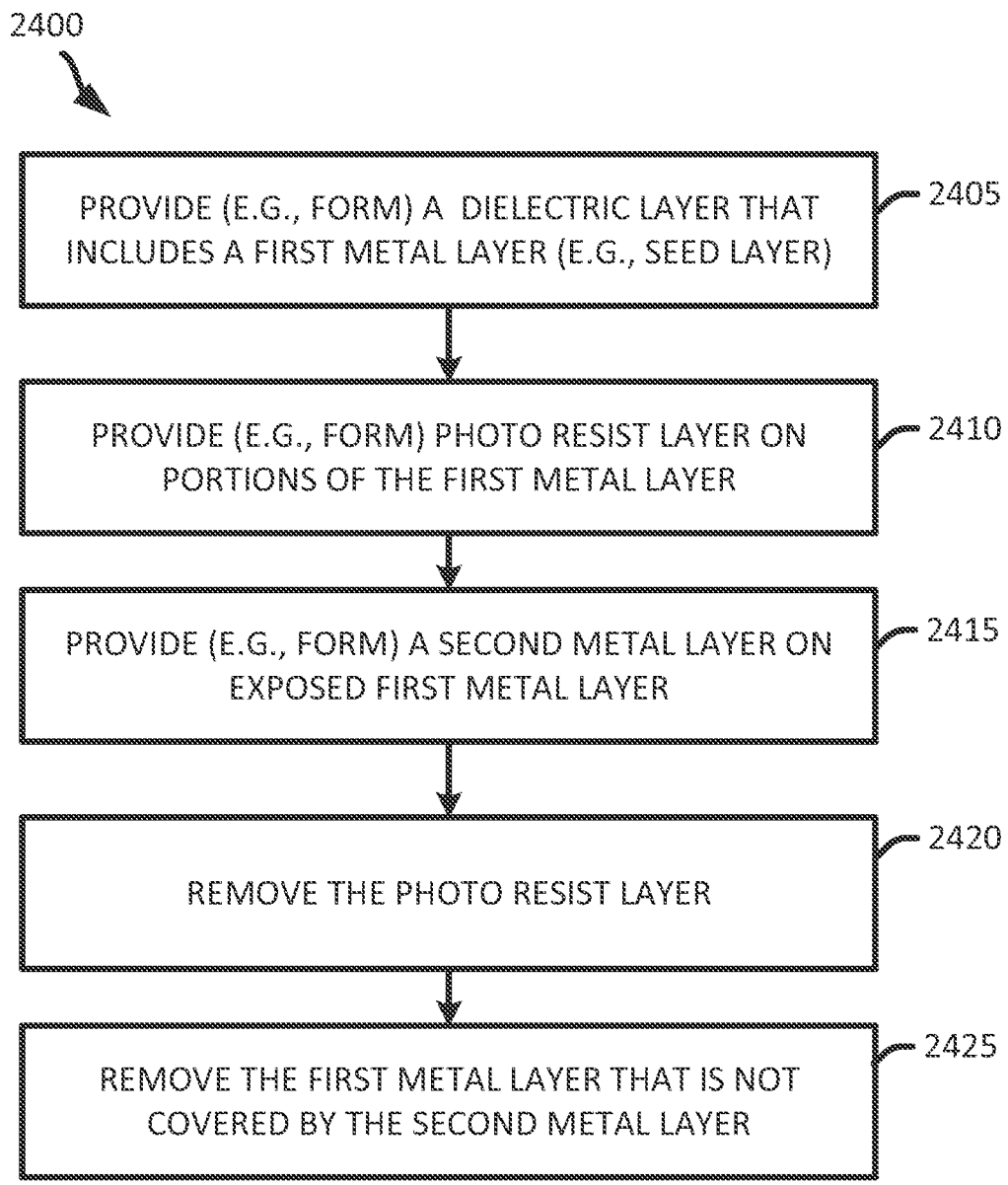
FIG. 24 illustrates an example of flow diagram of a semi-additive patterning (SAP) process.

FIG. 24 illustrates a flow diagram for a method for using a (SAP) process to provide and/or form an interconnect in one or more dielectric layer(s). The method provides (at 2405) a dielectric layer (e.g., dielectric layer 2302). In some implementations, providing the dielectric layer includes forming the dielectric layer. In some implementations, providing the dielectric layer includes forming a first metal layer (e.g., first metal layer 2304). The first metal layer is a seed layer in some implementations. In some implementations, the first metal layer may be provided (e.g., formed) on the dielectric layer after the dielectric layer is provided (e.g., received or formed). In some implementations, the first metal layer is provided by using a deposition process (e.g., physical vapor deposition (PVD) or plating process).

The method selectively provides (at 2410) a photo resist layer (e.g., a photo develop resist layer 2306) on the first metal layer. In some implementations, selectively providing the resist layer includes providing a first resist layer on the first metal layer and selectively removing portions of the resist layer (which provides one or more cavities).

The method then provides (at 2415) a second metal layer (e.g., second metal layer 2310) in the cavity of the photo resist layer. In some implementations, the second metal layer is formed over an exposed portion of the first metal layer. In some implementations, the second metal layer is provided by using a deposition process (e.g., plating process).

The method further removes (at 2420) the resist layer. Different implementations may use different processes for removing the resist layer. The method also selectively removes (at 2425) portions of the first metal layer. In some implementations, one or more portions of the first metal layer that is not covered by the second metal layer are removed. In some implementations, any remaining first metal layer and second metal layer may form and/or define one or more interconnects (e.g., trace, vias, pads) in an integrated device and/or a substrate. In some implementations, the above mentioned method may be iterated several times to provide and/or form several interconnects in one or more dielectric layers of an integrated device and/or substrate.

Exemplary Damascene Process

Figure 25:
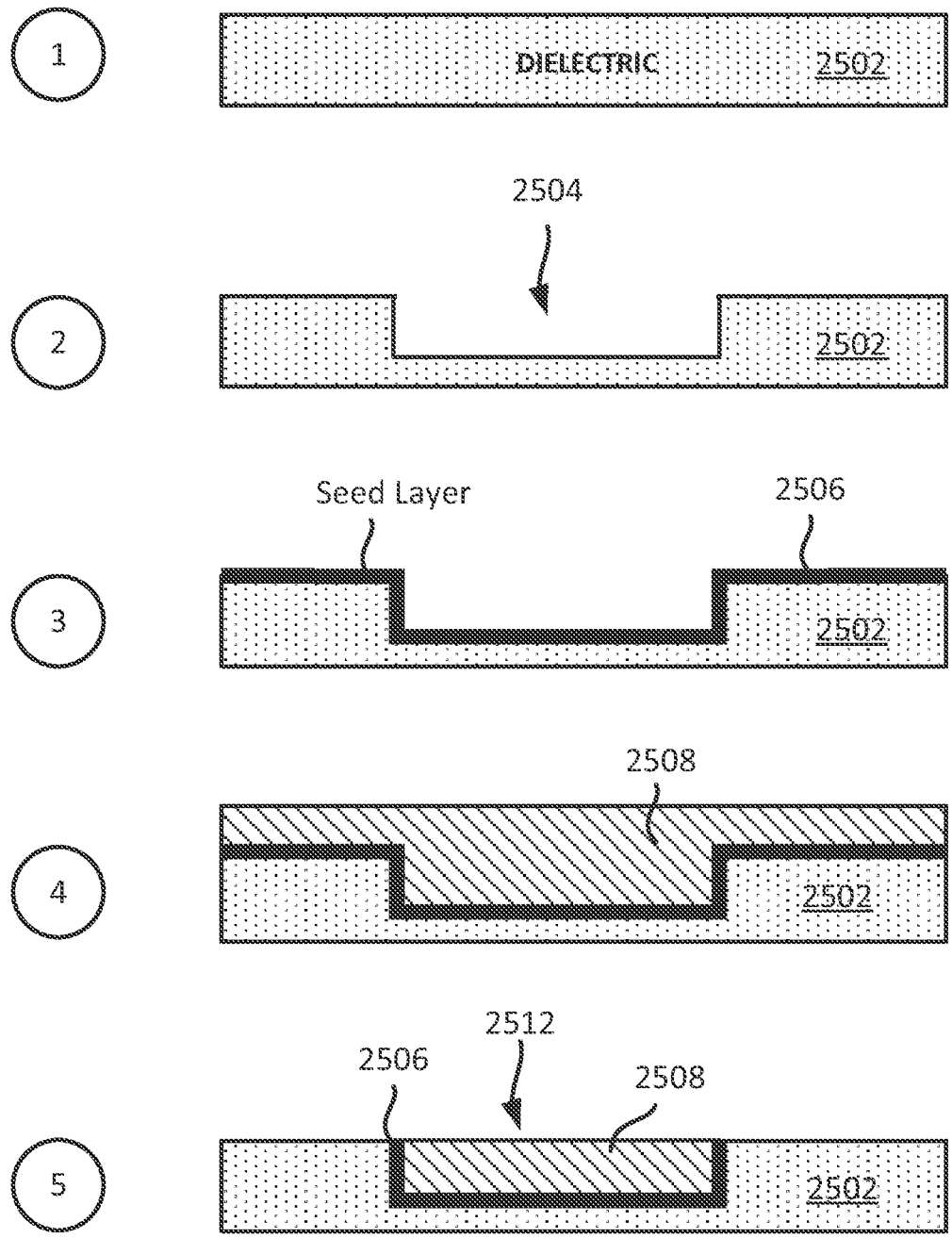
FIG. 25 illustrates an example of a damascene process.

FIG. 25 illustrates a sequence for forming an interconnect using a damascene process to provide and/or form an interconnect in a dielectric layer. As shown in FIG. 25, stage 1 illustrates a state of an integrated device after a dielectric layer 2502 is provided (e.g., formed). In some implementations, the dielectric layer 2502 is an inorganic layer (e.g., inorganic film).

Stage 2 illustrates a state of an integrated device after a cavity 2504 is formed in the dielectric layer 2502. Different implementations may use different processes for providing the cavity 2504 in the dielectric layer 2502.

Stage 3 illustrates a state of an integrated device after a first metal layer 2506 is provided on the dielectric layer 2502. As shown in stage 3, the first metal layer 2506 provided on a first surface of the dielectric layer 2502. The first metal layer 2506 is provided on the dielectric layer 2502 such that the first metal layer 2506 takes the contour of the dielectric layer 2502 including the contour of the cavity 2504. The first metal layer 2506 is a seed layer in some implementations. In some implementations, the first metal layer 2506 is provided by using a deposition process (e.g., physical vapor deposition (PVD), Chemical Vapor Deposition (CVD) or plating process).

Stage 4 illustrates a state of the integrated device after a second metal layer 2508 is formed in the cavity 2504 and a surface of the dielectric layer 2502. In some implementations, the second metal layer 2508 is formed over an exposed portion of the first metal layer 2506. In some implementations, the second metal layer 2508 is provided by using a deposition process (e.g., plating process).

Stage 5 illustrates a state of the integrated device after the portions of the second metal layer 2508 and portions of the first metal layer 2506 are removed. Different implementations may use different processes for removing the second metal layer 2508 and the first metal layer 2506. In some implementations, a chemical mechanical planarization (CMP) process is used to remove portions of the second metal layer 2508 and portions of the first metal layer 2506. As shown in stage 5, the remaining first metal layer 2506 and the second metal layer 2508 may form and/or define an interconnect 2512 (e.g., trace, vias, pads) in an integrated device and/or a substrate. As shown in stage 5, the interconnect 2512 is formed in such a way that the first metal layer 2506 is formed on the base portion and the side portion(s) of the second metal layer 2510. In some implementations, the cavity 2504 may include a combination of trenches and/or holes in two levels of dielectrics so that via and interconnects (e.g., metal traces) may be formed in a single deposition step, In some implementations, the above mentioned processes may be iterated several times to provide and/or form several interconnects in one or more dielectric layers of an integrated device and/or substrate.

Figure 26:
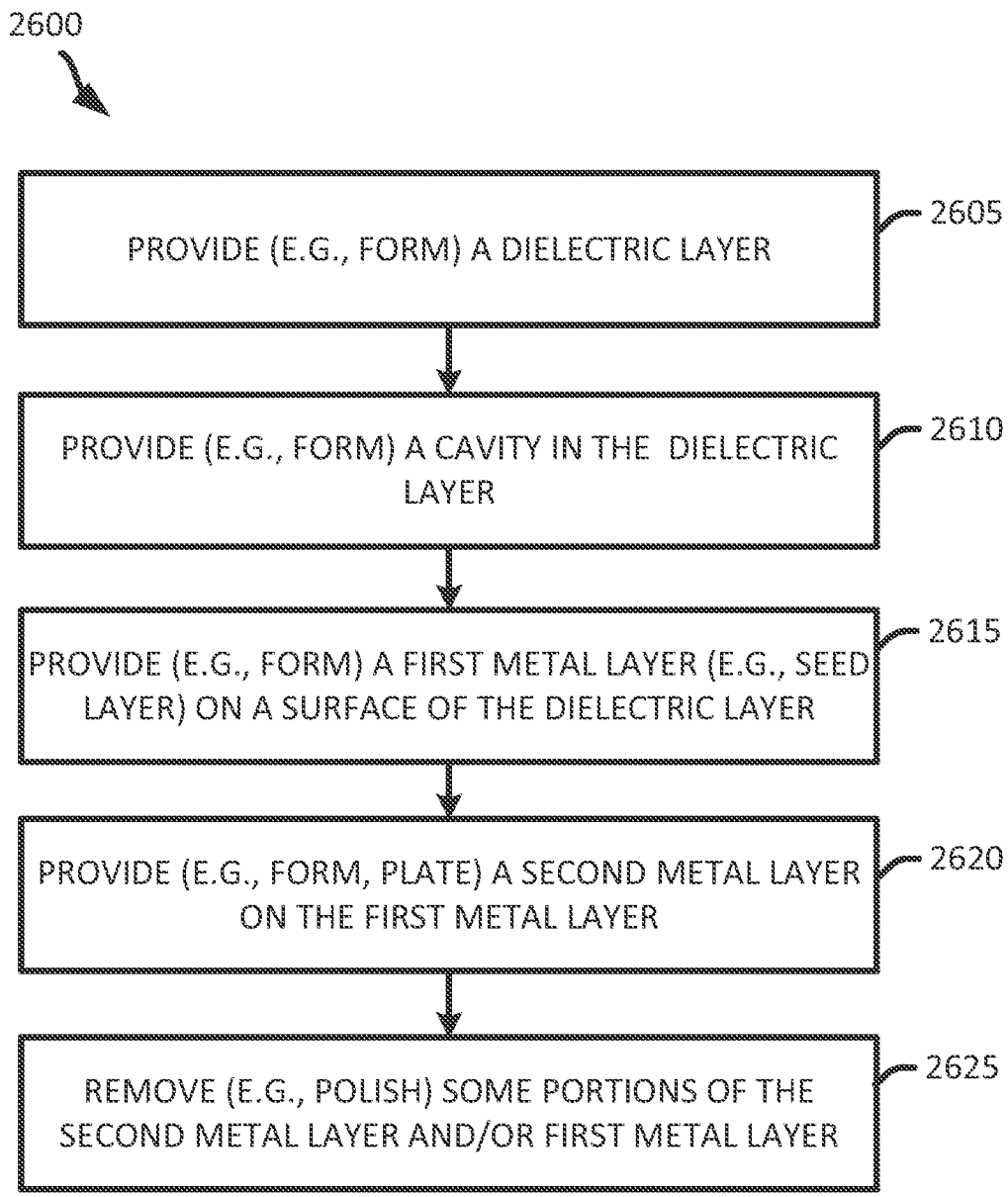
FIG. 26 illustrates an example of a flow diagram of a damascene process.

FIG. 26 illustrates a flow diagram of a method 2600 for forming an interconnect using a damascene process to provide and/or form an interconnect in a dielectric layer. The method provides (at 2605) a dielectric layer (e.g., dielectric layer 2502). In some implementations, providing a dielectric layer includes forming a dielectric layer. In some implementations, providing a dielectric layer includes receiving a dielectric layer from a supplier. In some implementations, the dielectric layer is an inorganic layer (e.g., inorganic film).

The method forms (at 2610) at least one cavity (e.g., cavity 2504) in the dielectric layer. Different implementations may use different processes for providing the cavity in the dielectric layer.

The method provides (at 2615) a first metal layer (e.g., first metal layer 2506) on the dielectric layer. In some implementations, the first metal layer is provided (e.g., formed) on a first surface of the dielectric later. In some implementations, the first metal layer is provided on the dielectric layer such that the first metal layer takes the contour of the dielectric layer including the contour of the cavity. The first metal layer is a seed layer in some implementations. In some implementations, the first metal layer 2506 is provided by using a deposition process (e.g., PVD, CVD or plating process).

The method provides (at 2620) a second metal layer (e.g., second metal layer 2508) in the cavity and a surface of the dielectric layer. In some implementations, the second metal layer is formed over an exposed portion of the first metal layer. In some implementations, the second metal layer is provided by using a deposition process (e.g., plating process). In some implementations, the second metal layer is similar or identical to the first metal layer. In some implementations, the second metal layer is different than the first metal layer.

The method then removes (at 2625) portions of the second metal layer and portions of the first metal layer. Different implementations may use different processes for removing the second metal layer and the first metal layer. In some implementations, a chemical mechanical planarization (CMP) process is used to remove portions of the second metal layer and portions of the first metal layer. In some implementations, the remaining first metal layer and the second metal layer may form and/or define an interconnect (e.g., interconnect 2512). In some implementations, an interconnect may include one of at least a trace, a via, and/or a pad) in an integrated device and/or a substrate. In some implementations, the interconnect is formed in such a way that the first metal layer is formed on the base portion and the side portion(s) of the second metal layer. In some implementations, the above mentioned method may be iterated several times to provide and/or form several interconnects in one or more dielectric layers of an integrated device and/or substrate.

Exemplary Electronic Devices

Figure 27:
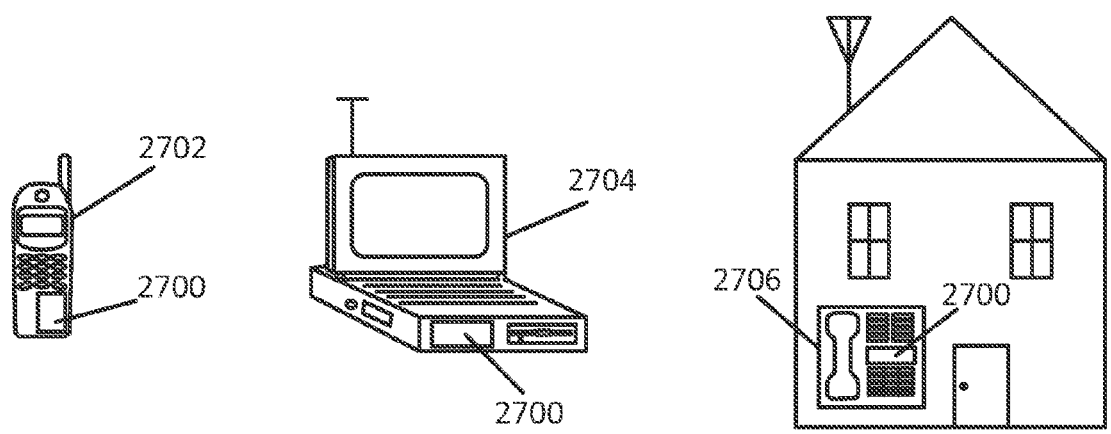
FIG. 27 illustrates various electronic devices that may integrate an integrated device, an integrated device package, a semiconductor device, a die, an integrated circuit, a substrate, an interposer and/or PCB described herein.

FIG. 27 illustrates various electronic devices that may be integrated with any of the aforementioned integrated device, semiconductor device, integrated circuit, die, interposer, package or package-on-package (PoP). For example, a mobile telephone 2702, a laptop computer 2704, and a fixed location terminal 2706 may include an integrated device 2700 as described herein. The integrated device 2700 may be, for example, any of the integrated circuits, dice, packages, package-on-packages described herein. The devices 2702, 2704, 2706 illustrated in FIG. 27 are merely exemplary. Other electronic devices nay also feature the integrated device 2700 including, but not limited to, mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3, 4, 5, 6, 7, 8, 9, 10, 11, 12, 13, 14, 15, 16, 17, 18, 19, 20, 21A-21C, 22, 23, 24, 25, 26 and/or 27 may be rearranged and/or combined into a single component, step, feature or function or embodied in several components, steps, or functions. Additional elements, components, steps, and/or functions may also be added without departing from the disclosure. It should also be noted that FIGS. 2, 3, 4, 5, 6, 7, 8, 9, 10, 11, 12, 13, 14, 15, 16, 17, 18, 19, 20, 21A-21C, 22, 23, 24, 25, 26 and/or 27 and its corresponding description in the present disclosure is not limited to dies and/or ICs. In some implementations, FIGS. 2, 3, 4, 5, 6, 7, 8, 9, 10, 11, 12, 13, 14, 15, 16, 17, 18, 19, 20, 21A-21C, 22, 23, 24, 25, 26 and/or 27 and its corresponding description may be used to manufacture, create, provide, and/or produce integrated devices. In some implementations, an integrated device may include a die, a die package, an integrated circuit (IC), an integrated device package, a wafer, a semiconductor device, a package on package, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

A 'set' of an object and/or element may include one or more of the object and/or element. For example a set of vias may include one or more vias. Similarly, a set of metal layers may include one or more of the metal layers. A set of interconnects may include one or more interconnects.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can he implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A substrate comprising:
    a first dielectric layer; and
    a capacitor embedded in the first dielectric layer, the capacitor comprising:
        a first terminal configured to operate at a first polarity;
        a second terminal configured to operate at a second polarity;
        a third terminal configured to operate at the first polarity, wherein the first terminal, the second terminal and the third terminal are positioned along a length of the capacitor such that the second terminal is located between the first terminal and the third terminal;
        a second dielectric layer;
        a first metal layer in the second dielectric layer, the first metal layer directly coupled to the first terminal and the third terminal; and
        a second metal layer in the second dielectric layer, the second metal layer directly coupled to the second terminal.

2. The substrate of claim 1, wherein the capacitor further comprises:
    a fourth terminal;
    a fifth terminal;
    a third metal layer in the second dielectric layer, the third metal layer coupled to the fourth terminal; and
    a fourth metal layer in the second dielectric layer, the fourth metal layer coupled to the fifth terminal, wherein the third and fourth metal layers are configured to change an equivalent series resistance (ESR) of the capacitor.

3. The substrate of claim 2, wherein the third metal layer is located between the first metal layer and the second metal layer in the second dielectric layer.

4. The substrate of claim 2, wherein the fourth and fifth terminals are dummy terminals that are configured to be free of a traversing signal in the substrate.

5. The substrate of claim 2, further comprising:
    a first set of vias coupled to the first terminal, the first set of vias located in the first dielectric layer;
    a second set of vias coupled to the second terminal, the second set of vias located in the first dielectric layer; and
    a third set of vias coupled to the third terminal, the third set of vias located in the first dielectric layer.

6. The substrate of claim 5, wherein the fourth and fifth terminals are free of a direct connection with a via.

7. The substrate of claim 1, wherein the capacitor further comprises:
    a fourth terminal coupled to the first metal layer; and
    a fifth terminal coupled to the second metal layer.

8. The substrate of claim 1, wherein the substrate includes one of at least a package substrate and/or an interposer.

9. The substrate of claim 1, wherein the substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

10. The substrate of claim 1, wherein the first metal layer, the first terminal and the third terminal are configured to operate at the first polarity, and wherein the second metal layer and the second terminal are configured to operate at the second polarity.

11. The substrate of claim 1, wherein the first terminal is configured to provide a first path for a first signal comprising the first polarity, and the second terminal is configured to provide a second path for second signal comprising the second polarity.

12. The substrate of claim 11, wherein the third terminal is configured to provide a third path for a third signal comprising the first polarity.

13. The substrate of claim 11, wherein the first signal comprises a ground reference signal, and the second signal comprises a power signal.

14. The substrate of claim 11, wherein the first signal comprises a power signal, and the second signal comprises a ground reference signal.

15. The substrate of claim 1, wherein the first terminal, the second terminal and the third terminal are positioned along the length of the capacitor to form alternating polarity terminals on the capacitor.

16. The substrate of claim 1, wherein the capacitor further comprises:
    a fourth terminal configured to operate at the second polarity; and
    a fifth terminal configured to operate at the first polarity.

17. The substrate of claim 16, wherein the first terminal, the second terminal, the third terminal, the fourth terminal and the fifth terminal are positioned along the length of the capacitor to form alternating polarity terminals on the capacitor.

18. The substrate of claim 16, wherein the second terminal is located between the first terminal and the third terminal such that there is no other terminal located between the first terminal and the second terminal, and such that there is no other terminal located between the second terminal and the third terminal.

19. The substrate of claim 1, wherein the first terminal and the first metal layer are configured to provide a first path for a first signal comprising the first polarity, and the second terminal and the second metal layer are configured to provide a second path for second signal comprising the second polarity.

* * * * *